(12) United States Patent
Yanagisawa et al.

(10) Patent No.: US 9,336,895 B2
(45) Date of Patent: May 10, 2016

(54) MEMORY DEVICE, SEMICONDUCTOR UNIT AND METHOD OF OPERATING THE SAME, AND ELECTRONIC APPARATUS

(71) Applicant: Sony Corporation, Tokyo (JP)

(72) Inventors: Yuki Yanagisawa, Kanagawa (JP); Shigeru Kanematsu, Kanagawa (JP); Matsuo Iwasaki, Nagasaki (JP)

(73) Assignee: SONY CORPORATION, Tokyo (JP)

( * ) Notice: Subject to any disclaimer, the term of this patent is extended or adjusted under 35 U.S.C. 154(b) by 16 days.

(21) Appl. No.: 14/395,986

(22) PCT Filed: Apr. 8, 2013

(86) PCT No.: PCT/JP2013/061136
§ 371 (c)(1),
(2) Date: Oct. 21, 2014

(87) PCT Pub. No.: WO2013/161595
PCT Pub. Date: Oct. 31, 2013

(65) Prior Publication Data
US 2015/0302932 A1    Oct. 22, 2015

(30) Foreign Application Priority Data
Apr. 27, 2012   (JP) ................................ 2012-103239

(51) Int. Cl.
| | |
|---|---|
| *G11C 17/06* | (2006.01) |
| *G11C 17/16* | (2006.01) |
| *G11C 13/00* | (2006.01) |
| *H01L 29/861* | (2006.01) |
| *H01L 29/68* | (2006.01) |

(52) U.S. Cl.
CPC ............ *G11C 17/16* (2013.01); *G11C 13/0011* (2013.01); *G11C 13/0069* (2013.01); *G11C 17/165* (2013.01); *H01L 29/685* (2013.01); *H01L 29/8615* (2013.01); *G11C 2013/0071* (2013.01); *G11C 2013/0073* (2013.01); *G11C 2213/72* (2013.01); *G11C 2213/79* (2013.01)

(58) Field of Classification Search
CPC ............... G11C 17/16; G11C 13/0011; G11C 13/0069; G11C 17/165; G11C 2013/0071; G11C 2013/0073; G11C 2213/72; G11C 2213/79; H01L 29/685; H01L 29/8615
USPC ............. 365/94, 96, 103, 104, 115, 174, 175, 365/186
See application file for complete search history.

(56) References Cited

U.S. PATENT DOCUMENTS

| | | | |
|---|---|---|---|
| 8,258,586 B1 * | 9/2012 | Mitchell ................ | G11C 17/16 257/410 |
| 8,659,929 B2 * | 2/2014 | Kumar ............... | G11C 13/0007 365/100 |
| 2006/0154467 A1 | 7/2006 | Hoffman et al. | |
| 2010/0108975 A1 | 5/2010 | Sun et al. | |
| 2011/0006377 A1 | 1/2011 | Lee et al. | |
| 2012/0212992 A1 * | 8/2012 | Kanematsu ............ | G11C 17/18 365/103 |

* cited by examiner

*Primary Examiner* — Fernando Hidalgo
(74) *Attorney, Agent, or Firm* — Hazuki International, LLC

(57) ABSTRACT

A semiconductor unit with memory devices, each of the memory devices includes: a first semiconductor layer; second and third semiconductor layers; a first dielectric film and a first conductive film; first, second, and third electrodes electrically connected to the second semiconductor layer, the third semiconductor layer, and the first conductive film, respectively, the third electrode being electrically connected to the first electrode. In the memory devices, when a voltage equal to or higher than a predetermined threshold value is applied between the first and second electrodes, a filament that is a conductive path electrically linking the second and third semiconductor layers is formed in the region between the second and third semiconductor layers, and thereby, writing operation of information is performed.

20 Claims, 27 Drawing Sheets

MEMORY DEVICE, SEMICONDUCTOR UNIT AND METHOD OF OPERATING THE SAME, AND ELECTRONIC APPARATUS

TECHNICAL FIELD

The present disclosure relates to a memory device suitable for a one-time programmable (OTP) device, to a semiconductor unit that includes such a memory device and a method of operating the semiconductor unit, and to an electronic apparatus that includes such a semiconductor unit.

BACKGROUND ART

An OTP device is a non-volatile memory device capable of storing information even when power of a unit is turned off. Several structures such as a fuse type and an anti-fuse type have been proposed for the OTP device.

In an OTP device of a fuse type, for example, a large current may be applied to a resistive device formed of a material such as polycrystalline silicon to fuse a resistor, and thereby, a state between both electrodes is varied from a short (short-circuit) state to an open (open-circuit) state. Thus, the OTP device of a fuse type performs writing operation. On the other hand, in an OTP device of an anti-fuse type, for example, a voltage equal to or higher than a dielectric withstand voltage is applied to a capacitor of a metal oxide semiconductor (MOS) type to breakdown a dielectric film, and thereby, a state between both electrodes is varied from an open state to a short state. In other words, the OTP device of an anti-fuse type performs information writing operation by varying the state between the both electrodes from an open state to a short state.

Moreover, for example, Patent Literature 1 proposes an OTP device of an anti-fuse type that utilizes a technique different from the above-described technique.

CITATION LIST

Patent Literature

PTL1: Japanese Unexamined Patent Application Publication (Translation of PCT Application) No. 2006-510203

SUMMARY

For a memory device (OTP device) such as those described above, it is generally desired, for example, to improve reliability of the device and to reduce an area thereof. Therefore, it is desired to propose a technique to achieve area reduction while improving reliability of the device.

It is desirable to provide a memory device capable of reducing an area thereof while improving reliability of the device, a semiconductor unit and a method of operating the semiconductor unit, and an electronic apparatus.

According to an embodiment of the present disclosure, there is provided a semiconductor unit with one or a plurality of memory devices, each of the one or the plurality of memory devices including: a first semiconductor layer of a first conductivity type; second and third semiconductor layers of a second conductivity type arranged to be separated from each other in the first semiconductor layer; a first dielectric film and a first conductive film both being provided on the first semiconductor layer in a region corresponding to a region between the second and third semiconductor layers, the first dielectric film being lower in layer than the first conductive film; a first electrode electrically connected to the second semiconductor layer; a second electrode electrically connected to the third semiconductor layer; and a third electrode electrically connected to the first conductive film, the third electrode being electrically connected to the first electrode. In the one or the plurality of memory devices, when a voltage equal to or higher than a predetermined threshold value is applied between the first electrode and the second electrode, a filament is formed in the region between the second semiconductor layer and the third semiconductor layer, and thereby, writing operation of information is performed, the filament being a conductive path electrically linking the second semiconductor layer and the third semiconductor layer.

According to an embodiment of the present disclosure, there is provided an electronic apparatus with a semiconductor unit with one or a plurality of memory devices, each of the one or the plurality of memory devices including: a first semiconductor layer of a first conductivity type; second and third semiconductor layers of a second conductivity type arranged to be separated from each other in the first semiconductor layer; a first dielectric film and a first conductive film both being provided on the first semiconductor layer in a region corresponding to a region between the second and third semiconductor layers, the first dielectric film being lower in layer than the first conductive film; a first electrode electrically connected to the second semiconductor layer; a second electrode electrically connected to the third semiconductor layer; and a third electrode electrically connected to the first conductive film, the third electrode being electrically connected to the first electrode. In the one or the plurality of memory devices, when a voltage equal to or higher than a predetermined threshold value is applied between the first electrode and the second electrode, a filament is formed in the region between the second semiconductor layer and the third semiconductor layer, and thereby, writing operation of information is performed, the filament being a conductive path electrically linking the second semiconductor layer and the third semiconductor layer.

According to an embodiment of the present disclosure, there is provided a memory device including: a first semiconductor layer of a first conductivity type; second and third semiconductor layers of a second conductivity type arranged to be separated from each other in the first semiconductor layer; a first dielectric film and a first conductive film both being provided on the first semiconductor layer in a region corresponding to a region between the second and third semiconductor layers, the first dielectric film being lower in layer than the first conductive film; a first electrode electrically connected to the second semiconductor layer; a second electrode electrically connected to the third semiconductor layer; and a third electrode electrically connected to the first conductive film, the third electrode being electrically connected to the first electrode. When a voltage equal to or higher than a predetermined threshold value is applied between the first electrode and the second electrode, a filament is formed in the region between the second semiconductor layer and the third semiconductor layer, and thereby, writing operation of information is performed, the filament being a conductive path electrically linking the second semiconductor layer and the third semiconductor layer.

In the semiconductor unit, the electronic apparatus, and the memory device according to the embodiments of the present disclosure, when a voltage equal to or higher than the predetermined threshold value is applied between the first electrode and the second electrode, the filament that is the conductive path electrically linking the second and third semiconductor layers is formed in the region between the second semiconductor layer and the third semiconductor layer, and thereby, the writing operation of information on the memory device is performed. Here, the first electrode and the third electrode are electrically connected to each other in the memory device. Therefore, for example, even when a leakage current is caused between the third semiconductor layer and the first conductive film by breakdown of the first dielectric film upon the writing operation, flowing of the leakage current to the outside of the memory device is suppressed without providing, for example, a circuit that controls a potential of the first conductive film (third electrode) or the like. As a result, degradation in disturb characteristics due to the flowing of the leakage current to the outside resulting from the writing operation is suppressed without complicating a circuit configuration.

According to an embodiment of the present disclosure, there is provided a method of operating a semiconductor unit, the method including, with respect to a memory device to be driven out of one or a plurality of memory devices each including: a first semiconductor layer of a first conductivity type; second and third semiconductor layers of a second conductivity type arranged to be separated from each other in the first semiconductor layer; a first dielectric film and a first conductive film both being provided on the first semiconductor layer in a region corresponding to a region between the second and third semiconductor layers, the first dielectric film being lower in layer than the first conductive film; a first electrode electrically connected to the second semiconductor layer; a second electrode electrically connected to the third semiconductor layer; and a third electrode electrically connected to the first conductive film, the third electrode being electrically connected to the first electrode, performing writing operation of information by applying, a voltage equal to or higher than a predetermined threshold value, between the first electrode and the second electrode to form a filament in the region between the second semiconductor layer and the third semiconductor layer, the filament being a conductive path electrically linking the second semiconductor layer and the third semiconductor layer.

In the method of operating the semiconductor unit according to the embodiment of the present disclosure with respect to the memory device to be driven out of the one or the plurality of memory devices, a voltage equal to or higher than the predetermined threshold value is applied between the first electrode and the second electrode to form the filament that is the conductive path electrically linking the second and third semiconductor layers in the region between the second semiconductor layer and the third semiconductor layer, and thereby, the writing operation of information on the memory device is performed. Here, the first electrode and the third electrode are electrically connected to each other in the memory device. Therefore, for example, even when a leakage current is caused between the third semiconductor layer and the first conductive film by breakdown of the first dielectric film upon the writing operation, the flowing of the leakage current to the outside of the memory device is suppressed without providing, for example, a circuit that controls a potential of the first conductive film (third electrode) or the like. As a result, degradation in disturb characteristics due to the flowing of the leakage current to the outside resulting from the writing operation is suppressed without complicating a circuit configuration.

It is to be noted that, as examples of another semiconductor unit and another electronic apparatus according to embodiments of the present disclosure, the following configuration may be provided. That is, another semiconductor unit according to an embodiment of the present disclosure includes one or a plurality of memory devices. Each of the one or the plurality of memory devices includes: a first semiconductor layer of a first conductivity type; second and third semiconductor layers of a second conductivity type arranged to be separated from each other in the first semiconductor layer; a first dielectric film and a first conductive film both being provided on the first semiconductor layer in a region corresponding to a region between the second and third semiconductor layers, the first dielectric film being lower in layer than the first conductive film; a first electrode electrically connected to the second semiconductor layer; a second electrode electrically connected to the third semiconductor layer; and a third electrode electrically connected to the first conductive film. In the memory device, when a voltage equal to or higher than a predetermined threshold value is applied between the first electrode and the second electrode, a filament that is a conductive path electrically linking the second semiconductor layer and the third semiconductor layer is formed in the region between the second semiconductor layer and the third semiconductor layer, and thereby, writing operation of information is performed. A selection transistor that selects a memory device to be driven out of the one or the plurality of memory devices is connected in series to each of the one or the plurality of memory devices in a one-to-one relationship. In the memory device to be driven, the selection transistor is turned on to allow voltages with opposite polarities to be applied to the respective first and second electrodes, and thereby a potential difference equal to or larger than the threshold value is generated between the first electrode and the second electrode.

Another electronic apparatus according to an embodiment of the present disclosure includes the above-described another semiconductor unit according to the embodiment of the present disclosure.

In the another semiconductor unit and the another electronic apparatus according to the embodiments of the present disclosure, when a voltage equal to or higher than the predetermined threshold value is applied between the first electrode and the second electrode, the filament that is the conductive path electrically linking the second and third semiconductor layers is formed in the region between the second semiconductor layer and the third semiconductor layer, and thereby, the writing operation of information on the memory device is performed. Here, in the memory device to be driven, voltages with opposite polarities are applied to the respective first and second electrodes, and thereby, a potential difference equal to or larger than the above-described threshold value is generated between the first electrode and the second electrode. As a result, a potential difference (a potential difference equal to or larger than the threshold value) necessary upon the writing operation is achieved by the sum of the absolute values of the voltages with the respective polarities. Therefore, the absolute value of the voltage applied to the first electrode, the second electrode, etc. is suppressed to a small value. As a result, withstand voltages of components such as the memory device and the selection transistor are set low, and thereby, area reduction is achieved while improving reliability of the device.

According to the semiconductor unit, the electronic apparatus, and the memory device according to the embodiments of the present disclosure, when a voltage equal to or higher than the predetermined threshold value is applied between the first electrode and the second electrode, the above-described filament is formed, and thereby, the writing operation of information on the memory device is performed. Also, the first electrode and the third electrode are electrically connected to each other in the memory device. Therefore, degradation in disturb characteristics due to the flowing of the leakage current to the outside resulting from the writing operation is suppressed without complicating a circuit configuration. Accordingly, area reduction is achieved while improving reliability of the device.

According to the method of operating the semiconductor unit according to the embodiment of the present disclosure, a voltage equal to or higher than the predetermined threshold value is applied between the first electrode and the second electrode in the memory device to be driven out of the one or the plurality of memory devices to form the above-described filament, and thereby, the writing operation of information on the memory device is performed. Also, the first electrode and the third electrode are electrically connected to each other in the memory device. Therefore, degradation in disturb characteristics due to the flowing of the leakage current to the outside resulting from the writing operation is suppressed without complicating a circuit configuration. Accordingly, area reduction is achieved while improving reliability of the device.

It is to be understood that both the foregoing general description and the following detailed description are exemplary, and are intended to provide further explanation of the technology as claimed.

DESCRIPTION OF EMBODIMENTS

Hereinafter, preferred embodiments of the present disclosure will be described in detail with reference to the drawings. The description will be given in the following order.
1. First Embodiment (a basic configuration example)
2. Modification 1 (an example provided with a silicide layer)
3. Second Embodiment (an example of writing operation that utilizes voltages with opposite polarities)
4. Modification 2 (an example in which a current extracting section is provided in a selection transistor)
5. Modification 3 (an example in which a diffusion layer for increasing a PN junction area is provided in the selection transistor)
6. Modification 4 (an example of writing operation that utilizes bipolar operation)
7. Third Embodiment (an example of writing operation that does not utilize voltages with opposite polarities)
8. Fourth Embodiment (an example in which wiring connection is not performed between electrodes in a memory device)
9. Fifth Embodiment (an example in which semiconductor layers are configured with conductivity types in an opposite relationship)
10. Application Examples (examples in which a semiconductor unit is applied to an electronic apparatus)
11. Other Modifications

First Embodiment

Block Configuration of Memory Unit 1

Figure 1:
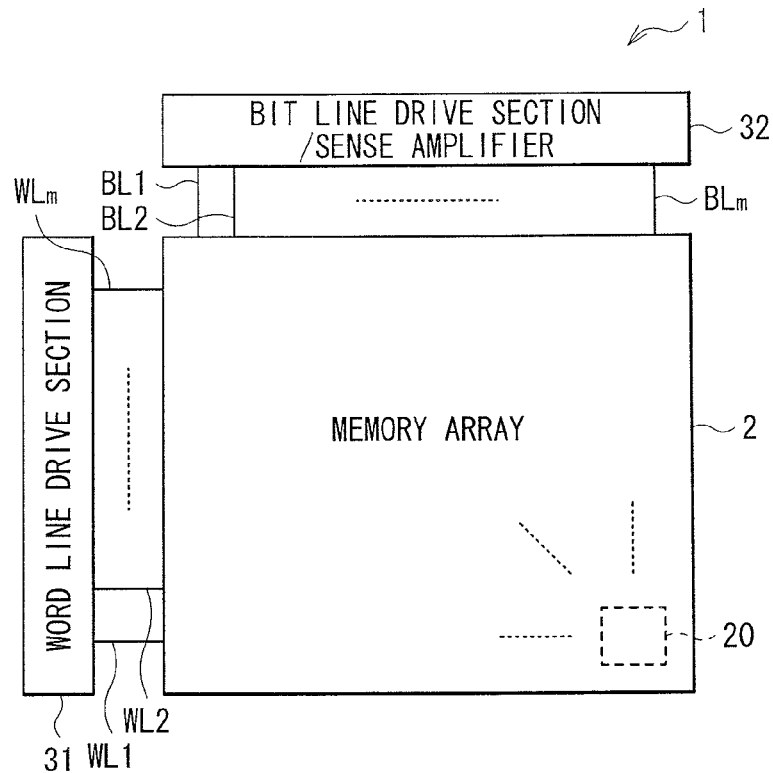
FIG. 1 is a block diagram illustrating a configuration example of a semiconductor unit (memory unit) according to a first embodiment of the present disclosure.

FIG. 1 illustrates a block configuration of a semiconductor unit (memory unit 1) according to a first embodiment of the present disclosure. The memory unit 1 is a memory unit (a so-called OTP ROM (Read Only Memory)) on which information (data) is written only once, from which the written information is readable for many times, and from which the information is not allowed to be erased.

The memory unit 1 includes a word line drive section 31, a bit line drive section/sense amplifier 32, and a memory array 2 that includes a plurality of memory cells 20. The word line drive section 31 and the bit line drive section/sense amplifier 32 out of the above-described components correspond to specific but not limitative examples of "drive section" (writing operation section, programming operation section) of the present disclosure.

The word line drive section 31 applies a predetermined electric potential (a word line potential which will be described later) to each of a plurality of (m-number of, where m is an integer of 2 or larger, in this example) word lines WL1 to WLm that are arranged in parallel in a row direction.

The bit line drive section/sense amplifier 32 applies a predetermined electric potential (a voltage for writing operation which will be described later) to each of a plurality of (m-number of, in this example) bit lines BL1 to BLm (and a plurality of reference lines SL which will be described later) that are arranged in parallel in a column direction. Thus, a predetermined voltage V1 (writing voltage) is applied to a later-described memory device 21 in the memory cell 20, and thereby, a later-described writing operation of information is performed. The bit line drive section/sense amplifier 32 performs an operation of reading information from each memory cell 20 with use of the above-described m-number of bit lines BL1 to BLm (and the plurality of reference lines SL) and also has a function of performing a predetermined signal amplification process in the sense amplifier therein. It is to be noted that "bit line BL" is appropriately used hereinafter to collectively refer to the bit lines BL1 to BLm.

As described above, the word line drive section 31 and the bit line drive section/sense amplifier 32 select a memory cell 20 to be driven (targeted for operation) from the plurality of memory cells 20 in the memory array 2, and selectively perform writing operation or reading operation of information.

[Circuit Configuration of Memory Array 2 and Memory Cell 20]

Figure 2:
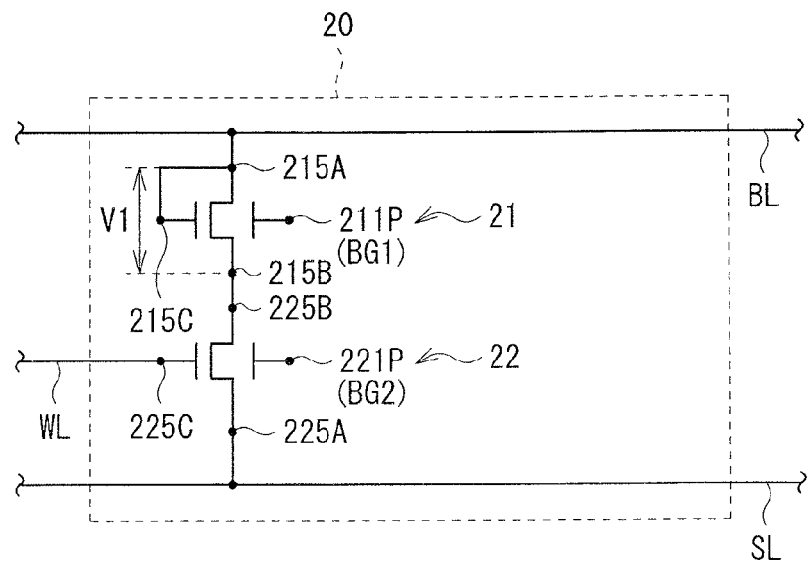
FIG. 2 is a circuit diagram illustrating a configuration example of a memory cell shown in FIG. 1.
Figure 3:
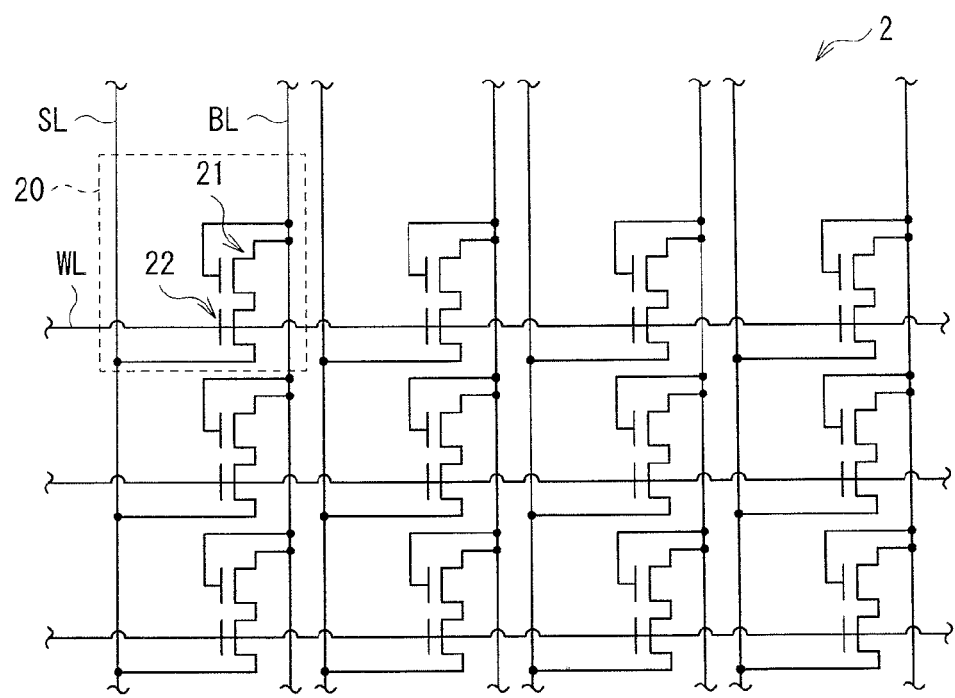
FIG. 3 is a circuit diagram illustrating a configuration example of a memory array shown in FIG. 1.

In the memory array 2, the plurality of memory cells 20 are arranged in rows and columns (in a matrix) as shown in FIG. 1. FIG. 2 illustrates a circuit configuration example of the memory cell 20. FIG. 3 illustrates a circuit configuration example of the memory array 2. In the memory array 2, one word line WL, one bit line BL, and one reference line SL are connected to each memory cell 20.

Moreover, each memory cell 20 includes one memory device 21 and one selection transistor 22 (the memory devices 21 and the selection transistors 22 are provided in a one-to-one relationship), and has a so-called "1T1R" type circuit configuration. In the memory cell 20, a gate (electrode 225C) of the selection transistor 22 is connected to the word line WL. One (electrode 225A) of a source and a drain of the selection transistor 22 is connected to the reference line SL, and the other (electrode 225B) thereof is connected to an electrode 215B (one of a source and a drain, in this example) of the memory device 21. Further, an electrode 215A of the memory device 21 (the other of the source and the drain, in this example) is connected to the bit line BL and is also connected to an electrode 215C (gate) of the memory device 21. In other words, the electrode 215A and the electrode 215C of the memory device 21 are electrically connected to each other. As described above, in each memory cell 20, one memory device 21 and one selection transistor 22 are connected in series to each other between the bit line BL and the reference line SL. It is to be noted that a semiconductor layer 211P shown in FIG. 2 which will be described later functions as a back gate (BG1) of the memory device 21. Similarly, a semiconductor layer 221P shown in FIG. 2 which will be described later functions as a back gate (BG2) of the selection transistor 22.

The memory device 21 is a device that stores information by the later-described writing operation, and is a so-called anti-fuse type OTP device which will be described in detail later. The selection transistor 22 is a transistor that selects a memory device 21 to be driven (targeted for writing operation and for reading operation), and may be configured of, for example, an MOS (Metal Oxide Semiconductor) transistor. However, this is not limitative, and a transistor with other configuration may be used.

[Cross-sectional Configuration of Memory Cell 20]

Figure 4:
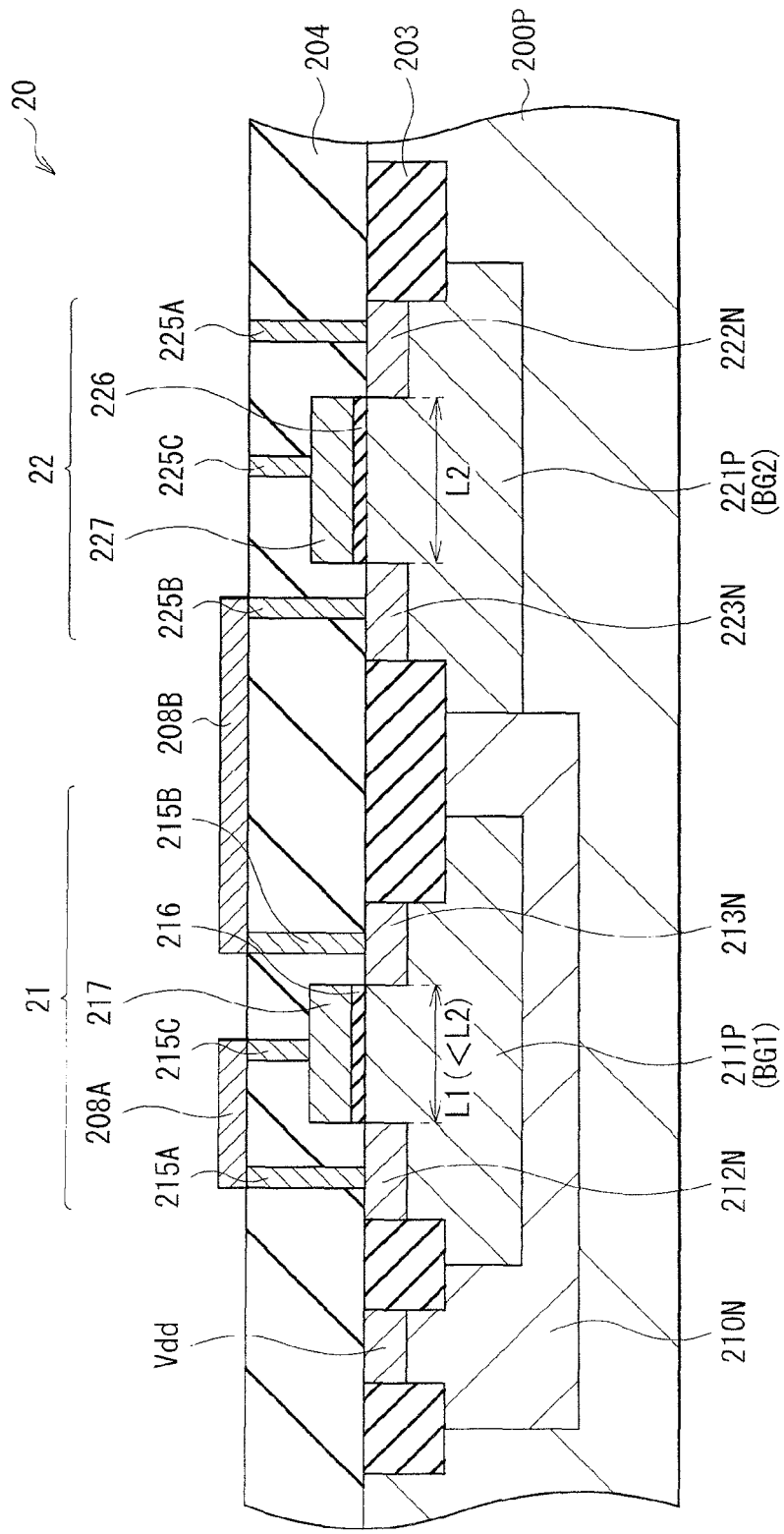
FIG. 4 is a schematic cross-sectional view illustrating a configuration example of a memory cell shown in FIG. 2.
Figure 5:
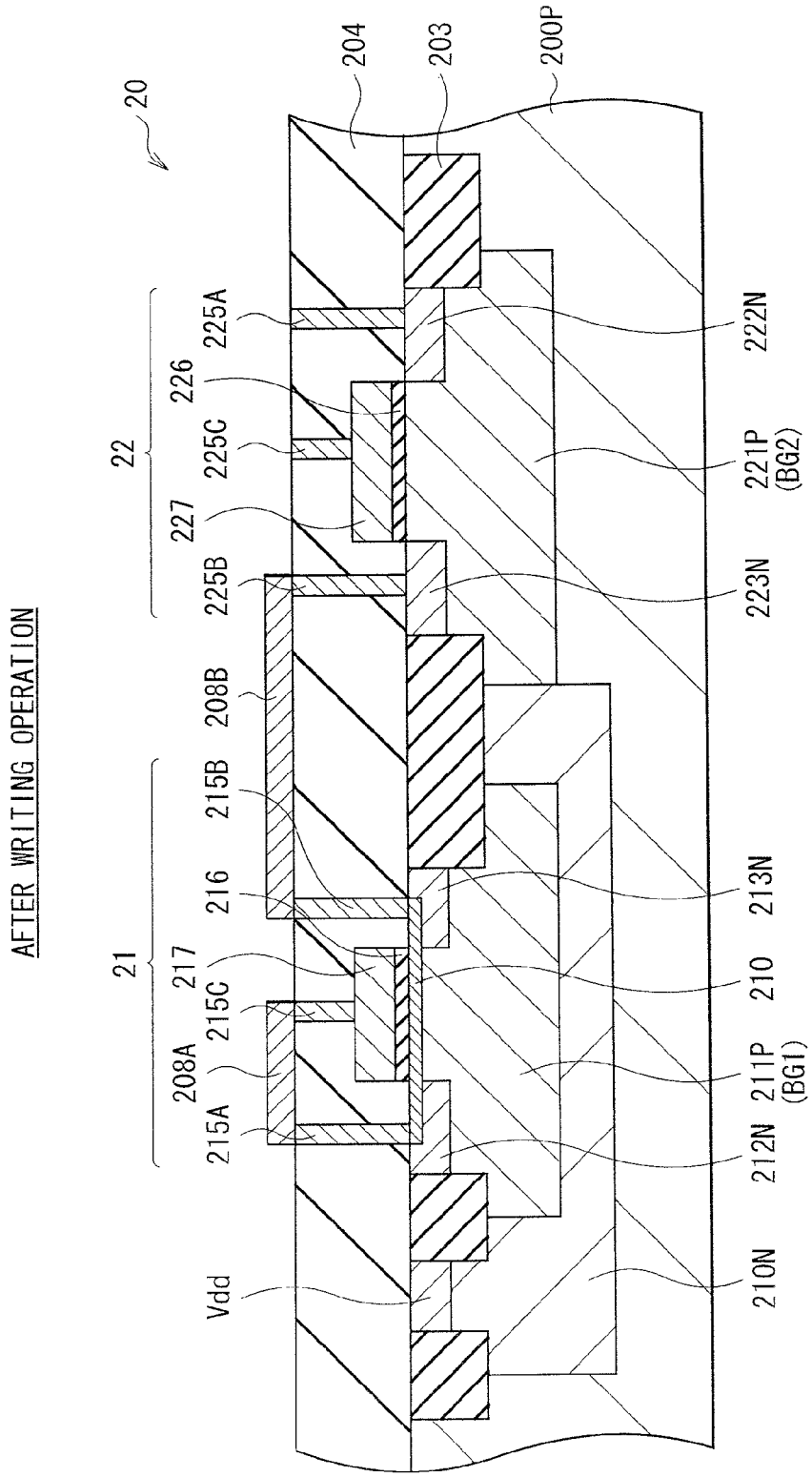
FIG. 5 is a schematic cross-sectional view illustrating a configuration example of a memory cell shown in FIG. 4 after writing operation.

FIGS. 4 and 5 each schematically illustrate a cross-sectional configuration example of the memory cell 20 that includes the memory device 21 and the selection transistor 22. FIG. 4 illustrates a cross-sectional configuration example before the later-described writing operation, and FIG. 5 illustrates a cross-sectional configuration example after the writing operation.

The memory device 21 and the selection transistor 22 are integrally formed on a single semiconductor substrate 200P. The semiconductor substrate 200P is a semiconductor substrate of a P-type (first conductivity type), and may be made, for example, of a semiconductor material in which, for example, silicon (Si) or the like is doped with an impurity such as boron (B).

[Memory Device 21]

As shown in FIG. 4, the memory device 21 before writing operation has a laminate structure that includes semiconductor layers 210N, 211P, 212N, and 213N, and the three electrodes 215A, 215B, and 215C, an insulating layer 204, a wiring 208A, a dielectric film 216, and a conductive film 217.

The semiconductor layer 210N (seventh semiconductor layer) is a semiconductor layer of an N-type (second conductivity type) provided in the semiconductor substrate 200P, and configures a so-called DNW (Deep N-Well). The semiconductor layer 210N may be made, for example, of a semiconductor material in which, for example, silicon (Si) or the like is doped with an impurity such as arsenic (As) and phosphorus (P).

The semiconductor layer 211P (first semiconductor layer) is a P-type semiconductor layer, and is formed in the above-described semiconductor layer 210N. The semiconductor layer 211P configures a so-called P-well, and also functions as the back gate (BG1) of the memory device 21 as described above. The semiconductor layer 211P may be made, for example, of a semiconductor material in which, for example, Si or the like is doped with an impurity such as B.

The semiconductor layer 212N (second semiconductor layer) and the semiconductor layer 213N (third semiconductor layer) are so arranged to be separated from each other with a predetermined space in between in the semiconductor layer 211P, and are each an N-type semiconductor layer (each forms a so-called N+ layer). The semiconductor layers 212N and 213N may be each made, for example, of a semiconductor material in which, for example, Si or the like is doped with an impurity such as As and P, and each have a thickness of about 50 nm to 200 nm both inclusive. Such semiconductor layers 212N and 213N are easily formed in a region of the semiconductor layer 211P, for example, by a method such as a method using self-alignment and a method using a mask pattern such as a predetermined photoresist and an oxide film. Here, it is preferable to allow a distance (separation length L1) between the semiconductor layers 212N and 213N to be as short as possible (for example, about 50 nm to 200 nm both inclusive) since the memory device 21 with small device size is thereby achievable.

The dielectric film 216 (first dielectric film) is provided on the semiconductor layer 211P in a region (in a region between the semiconductor layers 212N and 213N and in part of regions in the semiconductor layers 212N and 213N, in this example) corresponding to a region between the semiconductor layers 212N and 213N. The dielectric film 216 may be made, for example, of an insulating material (dielectric body) similar to that of a typical gate insulating film in an MOS transistor, such as silicon oxide ($SiO_2$), and has a thickness of about several nm to 20 nm both inclusive.

The conductive film 217 (first conductive film) is provided on a region in which the dielectric film 216 is formed, and thus, a laminate structure that includes the dielectric film 216 and the conductive film 217 higher in layer than the dielectric film 216 is formed. The conductive film 217 may be formed, for example, of a conductive material such as polycrystalline silicon and silicide metal, and has a thickness of about 50 nm to 500 nm both inclusive.

The insulating layer 204 is so provided as to cover a region above the semiconductor substrate 200P, the semiconductor layers 212N and 213N, the conductive film 217, semiconductor layers 222N and 223N which will be described later, and the conductive film 227. The insulating layer 204 may be formed, for example, of an insulating material such as $SiO_2$ and silicon nitride ($SiN_x$), and has a thickness of about 50 nm to 1000 nm both inclusive.

The electrode 215A (first electrode) is provided in the insulating layer 204 so as to be electrically connected to the semiconductor layer 212N on the semiconductor layer 212N. Thus, a predetermined potential (one of a source potential and a drain potential) is allowed to be applied to the semiconductor layer 212N.

The electrode 215B (second electrode) is provided in the insulating layer 204 so as to be electrically connected to the semiconductor layer 213N on the semiconductor layer 213N. Thus, a predetermined potential (the other of the source potential and the drain potential) is allowed to be applied to the semiconductor layer 213N.

The electrode 215C (third electrode) is provided so as to be electrically connected to the conductive film 217. Further, the electrode 215C is electrically connected to the electrode 215A through the wiring 208A provided on the insulating layer 204. In other words, the electrode 215A and the electrode 215C in the memory device 21 are electrically connected to each other through the wiring 208A.

It is to be noted that the electrodes 215A, 215B, and 215C and the wiring 208A are each may be formed, for example, of a conductive material such as metal such as tungsten (W) and aluminum (Al).

On the other hand, as shown in FIG. 5, a filament 210 (conductive path section) which will be described below is formed in addition to the semiconductor layers 210N, 211P, 212N, and 213N, the electrodes 215A, 215B, and 215C, the insulating layer 204, the wiring 208A, the dielectric film 216, and the conductive film 217, which are described above, in the memory device 21 after writing operation.

The filament 210 is formed in a region between the semiconductor layers 212N and 213N with the semiconductor layer 211P in between, and functions as a conductive path that electrically links the semiconductor layers 212N and 213N (electrodes 215A and 215B) as will be described in detail later. In other words, in the memory device 21 shown in FIG. 5, the semiconductor layers 212N and 213N are short-circuited (in a short state) with a predetermined resistance value (with a resistance component) by the filament 210. It is to be noted that the resistance value of the filament 210 is preferably set to be sufficiently lower than an ON-resistance value of the selection transistor 22. Such a filament 210 is formed by one or both of a conductive component configuring the electrode 215A and a conductive component configuring the electrode 215B being moved by migration when a voltage V1 equal to or higher than a predetermined threshold value is applied between the electrodes 215A and 215B (see FIG. 2). It is to be noted that the details of the principle by which the filament 210 is formed will be described later.

[Selection Transistor 22]

As shown in FIGS. 4 and 5, the selection transistor 22 before the writing operation and the selection transistor 22 after the writing operation both have the laminate structure that includes the semiconductor layers 221P, 222N, and 223N, the three electrodes 225A, 225B, and 225C, the insulating layer 204, a dielectric film 226, and the conductive film 227.

The semiconductor layer 221P (fourth semiconductor layer) is a P-type semiconductor layer provided in the semiconductor substrate 200P. The semiconductor layer 221P configures a so-called P-well, and functions also as the back gate (BG2) of the selection transistor 22 as described above. The semiconductor layer 221P may be formed, for example, of a semiconductor material in which, for example, Si or the like is doped with an impurity such as B. Further, the semiconductor layer 221P and the semiconductor layer 211P in the memory device 21 are electrically separated by the semiconductor layer 210N in the memory device 21.

The semiconductor layer 222N (fifth semiconductor layer) and the semiconductor layer 223N (sixth semiconductor layer) are so arranged as to be separated from each other with a predetermined space in between in the semiconductor layer 221P, and are each an N-type semiconductor layer (each form a so-called N+ layer). The semiconductor layers 222N and 223N may be each made, for example, of a semiconductor material in which, for example, Si or the like is doped with an impurity such as As and P, and each have a thickness of about 50 nm to 200 nm both inclusive. Such semiconductor layers 222N and 223N are easily formed in a region of the semiconductor layer 221P, for example, by a method such as a method using self-alignment and a method using a mask pattern such as a predetermined photoresist and an oxide film. Here, it is preferable that the distance (separation length L1) between the semiconductor layers 212N and 213N in the memory device 21 be shorter than a distance (separation length L2) between the semiconductor layers 222N and 223N (L1<L2). In other words, it is preferable that a width (a length in a direction crossing from the semiconductor layer 212N to the semiconductor layer 213N: separation length L1) of the conductive film 217 corresponding to a gate length of the MOS transistor in the memory device 21 be narrower than a gate length (separation length L2) of the selection transistor 22 formed of the MOS transistor. One reason is that this lowers an isolation withstand voltage between the semiconductor layers 212N and 213N. As a result, the voltage V1 upon operation of writing on the memory device 21 is suppressed to a low value and the selection transistor 22 is protected. Also, the filament 210 is formed more easily.

The dielectric film 226 (second dielectric film) is provided on the semiconductor layer 221P in a region (in a region between the semiconductor layers 222N and 223N and in part of regions in the semiconductor layers 222N and 223N, in this example) corresponding to a region between the semiconductor layers 222N and 223N. The dielectric film 226 may be made, for example, of an insulating material similar to that of a typical gate insulating film in an MOS transistor, such as $SiO_2$, and has a thickness of about several nm to 20 nm both inclusive.

The conductive film 227 (second conductive film) is provided on a region in which the dielectric film 226 is formed, and thus, a laminate structure that includes the dielectric film 226 and the conductive film 227 higher in layer than the dielectric film 226 is formed. The conductive film 227 may be formed, for example, of a conductive material such as polycrystalline silicon and silicide metal, and has a thickness of about 50 nm to 500 nm both inclusive.

The electrode 225A (fourth electrode) is provided in the insulating layer 204 so as to be electrically connected to the semiconductor layer 222N on the semiconductor layer 222N. Thus, a predetermined potential (one of a source potential and a drain potential) is allowed to be applied to the semiconductor layer 222N.

The electrode 225B (fifth electrode) is provided in the insulating layer 204 on the semiconductor layer 223N so as to be electrically connected to the semiconductor layer 223N on the semiconductor layer 223N. Further, the electrode 225B is electrically connected to the electrode 215B in the memory device 21 through the wiring 208B provided on the insulating layer 204. In other words, the electrode 215B in the memory device 21 and the electrode 225B in the selection transistor 22 are electrically connected to each other through the wiring 208B.

The electrode 225C (sixth electrode) is provided so as to be electrically connected to the conductive film 227.

It is to be noted that the electrodes 225A, 225B, and 225C and the wiring 208B may each be formed, for example, of a conductive material such as metal such as W and Al.

Moreover, the memory cell 20 with the above-described configuration includes a device separation section 203 that electrically insulates and separates adjacent devices. The device separation section 203 may be, for example, a component called STI (Shallow Trench Isolation). Such a device separation section 203 may be provided, for example, between the memory device 21 and the selection transistor 22 (between the semiconductor layers 213N and 223N), between the memory device 21 (semiconductor layer 212N) and an electric power source line Vdd, etc., in particular.

[Functions and Effects of Memory Unit 1]
[1. Basic Operation]

In the memory unit 1, as shown in FIGS. 1 to 3, the word line drive section 31 applies a predetermined potential (word line potential) to the m-number of word lines WL1 to WLm. Further, the bit line drive section/sense amplifier 32 applies a predetermined potential (voltage for writing operation) to the m-number of bit lines BL1 to BLm and the m-number of reference lines SL. Thus, a memory cell 20 to be driven (targeted for the writing operation) is selected from the plurality of memory cells 20 in the memory array 2, and the predetermined voltage V1 which will be described later is applied to the memory device 21 to be driven. The operation of writing information on the memory device 21 (only once) is selectively performed thereby.

On the other hand, the bit line drive section/sense amplifier 32 performs operation of reading information from the memory device 21 in the memory cell 20 to be driven (targeted for reading operation) with use of the m-number of bit lines BL1 to BLm and the m-number of reference lines SL, and performs a predetermined signal amplification process in the sense amplifier therein. Thus, the operation of reading information from the memory device 21 is selectively performed.

Here, upon selecting a memory cell 20 (memory device 21) to be driven (targeted for writing operation or reading operation), the predetermined potential (word line potential) is applied to the word line WL connected to that memory cell 20. Further, the predetermined voltage (voltage for writing operation) is applied to the bit line BL and the reference line SL connected to that memory cell 20. On the other hand, in the memory cell 20 other than the memory cell 20 to be driven, a ground potential (for example, 0 V) is applied to the connected word line WL, and, the connected bit line BL is set to be in a floating state or at the ground potential (0 V). Thus, the writing operation or the reading operation is performed after selecting the memory device 21 to be driven by turning on the selection transistor 22 in the memory cell 20 to be driven.

[2. Concerning Details of Writing Operation]

Next, description will be given of the details of the writing operation in the present embodiment in comparison to a comparative example.

Comparative Example

Figure 6:
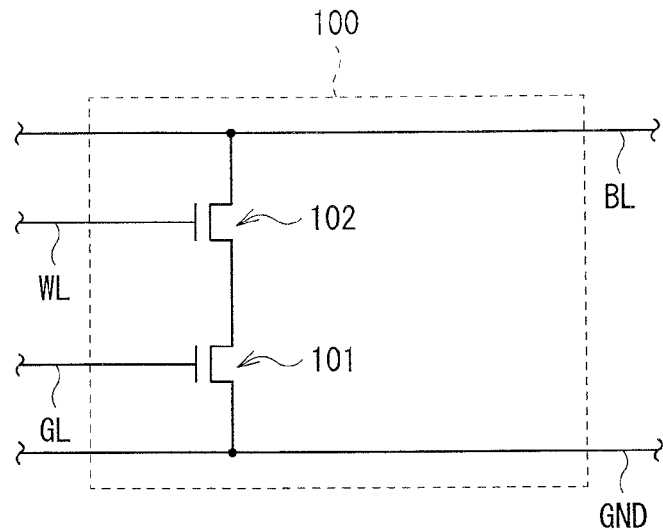
FIG. 6 is a circuit diagram illustrating a configuration of a memory cell in a memory unit according to a comparative example.

FIG. 6 illustrates a circuit configuration of a memory cell (memory cell 100) in a memory unit according to the comparative example. The memory cell 100 of the comparative example has one memory device 101 (OTP device) configured of a transistor, and one selection transistor 102. In this memory cell 100, a gate of the selection transistor 102 is connected to a word line WL. One of a source and a drain of the selection transistor 102 is connected to a bit line BL, and the other thereof is connected to one of a source and a drain of the memory device 101. Further, the other of the source and the drain of the memory device 101 is connected to the ground GND, and a gate thereof is connected to a gate line GL to which a predetermined gate voltage Vg is applied.

In this memory cell 100, operation of writing information on the memory device 101 is performed utilizing a snapback phenomenon in a MOS transistor. The snapback phenomenon is a phenomenon in which, when a predetermined voltage (gate voltage) is applied to a gate to turn on a transistor, and then, the gate voltage is lowered, strong pinch off is forcibly caused, and a large current flows between a source and a drain with a voltage lower than the withstand voltage of an ordinary MOS transistor.

Figure 7:
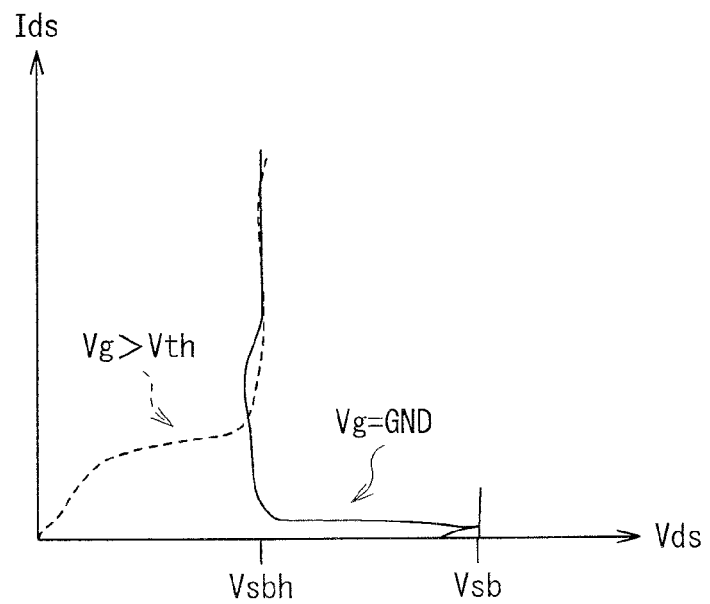
FIG. 7 is a characteristic diagram for explaining a writing method in the memory cell shown in FIG. 6.

Upon the operation of writing on the memory device 101, first, a voltage equal to or higher than a predetermined threshold voltage Vth is applied to the gate of each of the memory device 101 and the selection transistor 102, which are then both set to be in an ON state (gate voltage Vg of the memory device 101>Vth: see FIG. 7). Subsequently, a voltage that is not higher than the withstand voltage of each of the memory device 101 and the selection transistor 102 is applied to the bit line BL, and thereby, the memory device 101 and the selection transistor 102 are set to be in a state in which a current is flowable therein. Subsequently, the gate voltage Vg of the memory device 101 is lowered (for example, to Vg=potential of the ground GND: see FIG. 7), and the memory device 101 is set to be in a snapback mode. This causes a large current to flow between the source and the drain of the memory device 101 as described above, and thereby, a PN junction is destroyed, which results in short circuit between the source and the drain (the source and the drain are short-circuited). In other words, in the memory device 101, in a manner similar to that of a typical anti-fuse type OTP device, a state between both electrodes (the source and the drain) is varied from an open state to a short state, and thereby, the writing operation of information is performed.

However, in the writing operation in the comparative example, the large current that flows at the time of the snap-back phenomenon destroys the PN junction, and therefore, the large current also flows into the selection transistor 102. Here, in this technique, the large current is applied by lowering the gate voltage Vg of the memory device 101 from the state (ON state) in which a current flows in both the memory device 101 and the selection transistor 102 to set the memory device 101 to be the snapback mode, as described above. Therefore, there may be a concern that, when a resistance value of the selection transistor 102 in the first ON state is large, the voltage between both ends (the source and the drain) of the memory device 101 may be lowered due to voltage drop. Therefore, in the selection transistor 102, it is necessary to lower the resistance value, for example, by setting a width (gate width) of a channel region to be wide. This leads to increase in device size of the selection transistor 102.

In addition thereto, the selection transistor 102 is also used to select the memory device 101 to be read upon the reading operation after the writing operation. Therefore, destruction of the selection transistor 102 upon the writing operation is not acceptable. Therefore, it is preferable to provide the selection transistor 102 with high current ability that allows a sufficient amount of current to flow in an ON state upon the writing operation. Also in this point of view, it is necessary to allow the selection transistor 102 to have a device size larger than that of the memory device 101.

As can be seen from the above, although the memory device 101 of the comparative example is allowed to be formed in a device size similar to that of an ordinary MOS transistor, the selection transistor 102 that is used in combination with the memory device 101 has a device size larger than that of the memory device 101. As a result, a device area of the memory cell 100 as a whole per 1 bit becomes larger.

As described above, it is difficult to reduce the area of the memory unit (semiconductor unit) in the writing operation technique in the existing OTP device that includes the memory device 101 of the comparative example.

[Writing Operation of Present Embodiment]

On the other hand, in the memory unit 1 according to the present embodiment, the word line drive section 31 and the bit line drive section/sense amplifier 32 perform the operation of writing information on the memory device 21 in the memory cell 20 as shown in FIGS. 2, 4, and 5.

In other words, the word line drive section 31 and the bit line drive section/sense amplifier 32 apply the voltage V1 equal to or higher than the predetermined threshold value between the electrodes 215A and 215B of the memory device 21 to be driven of the plurality of memory devices 21 in the memory array 2. Here, the voltage of the predetermined threshold value refers to the foregoing voltage at which the filament 210 is formed in the memory device 21, which may be, for example, about several V to 20 V both inclusive. It is to be noted that, at this time, the semiconductor layer 211P (back gate BG1) may be set at a ground potential (a potential of the ground GND), or may be set at a floating state (open state), for example.

Here, it is considered that the filament 210 is formed based on the principle as follows. That is, first, when the above-described voltage V1 is applied between the electrodes 215A and 215B of the memory device 21, the semiconductor layers 212N and 213N are broken down and a current flows therebetween, in a manner similar to that in an isolation withstand voltage phenomenon between a collector and an emitter that occurs in a typical bipolar transistor. By migration due to heat resulting from the current flowing at this time, one or both of the conductive component configuring the electrode 215A and the conductive component configuring the electrode 215B are moved into the semiconductor layer 211P. It is considered that the filament 210 is formed as a result of this.

As described above, in the memory unit 1 of the present embodiment, the memory device 21 on which the above-described writing operation is not performed (information is not written) is in an open-circuit state (open state) in which the semiconductor layers 212N and 213N are electrically separated as shown in FIG. 4. On the other hand, the memory device 21 after the above-described writing operation (on which information is written) is in a state (short state) in which the semiconductor layers 212N and 213N are electrically connected to each other with a resistance component due to the formation of the filament 210 as shown in FIG. 5. In other words, the memory device 21 is allowed to function as an anti-fuse type OTP device.

It is to be noted that, in "open state" before the above-described writing operation, a small amount of leakage current flows in fact, and therefore, to be strict, a complete open state is not achieved. However, a difference between the currents flowing between the semiconductor layers 212N and 213N before the writing operation (before the formation of the filament 210) and after the writing operation (after the formation of the filament 210) is large. Therefore, the states before and after the operation are differentiated and detected. Also taking into consideration the above-described matter, it is preferable to allow the separation length L1 between the semiconductor layers 212N and 213N to be narrow in a degree that amount of the leakage current does not become a problem, so as to easily form the filament 210.

In the above-described writing operation of the present embodiment, unlike the technique in the existing OTP device including the foregoing comparative example, writing operation is achieved, for example, without adopting a high withstand voltage memory device or without applying a large current upon writing operation. This will be described in detail below.

First, upon the writing operation, as described above, the predetermined word potential is applied to the gate of the selection transistor 22 to turn on the selection transistor 22, and then, the voltage (voltage for writing operation) equal to or higher than the predetermined value is applied to the bit line BL and to the reference line SL. At this time, although the selection transistor 22 is turned on, only a current of a degree of a leakage current flows therein. Therefore, voltage drop in the selection transistor 22 is almost negligible. Accordingly, the potential difference (voltage) between the potential of the bit line BL and the potential of the reference line SL is applied almost as it is between the both ends (between the electrodes 215A and 215B) of the memory device 21. In other words, the selection transistor 22 is turned on, and this results in occurrence of a voltage (potential difference) equal to or higher than the threshold voltage, between the electrodes 215A and 215B in the memory device 21 to be driven.

The followings can be said when the voltages applied to the bit line BL and the reference line SL are each set to be equal to or lower than a withstand voltage of the selection transistor 22. That is, the writing operation on the memory device 21 is performed without destroying the selection transistor 22 since the selection transistor 22 that is used also upon reading operation only receives a voltage equal to or lower than the withstand voltage of the transistor upon the writing operation. It can be said from this that the MOS transistor obtained in the process of forming the memory device 21 is allowed to be used as the selection transistor 22 without separately providing a high withstand voltage transistor for the writing operation on the memory device 21.

As described above, in the memory device 21 of the present embodiment, an OTP device is achieved with a device area as small as that of a typical MOS transistor. Therefore, an OTP device with an area smaller than that of the existing OTP device is achieved, which is especially advantageous in a case where the number of bits is large. Also, the memory device 21 of the present embodiment is extremely advantageous in terms of wafer cost since the memory device 21 is formed within a step of typical CMOS (Complementary Metal Oxide Semiconductor) process.

Moreover, in the memory device 21 of the present embodiment, the electrode 215A and the electrode 215C are electrically connected to each other as described above. Therefore, for example, even when a leakage current occurs between the semiconductor layer 213N and the conductive film 217 due to insulation breakdown of the dielectric film 216 upon the writing operation, the following occurs. That is, flowing of the leakage current to the outside of the memory device 21 (for example, to the word line WL) is suppressed, for example, without providing a component such as a circuit (gate control circuit) that controls the potential of the conductive film 217 (electrode 215C). As a result, degradation in disturb characteristics (occurrence of defect in write disturb) due to the flowing of the leakage current to the outside resulting from the writing operation is suppressed without complicating the circuit configuration (configurations of the peripheral circuits such as the word line drive section 31 and the bit line drive section/sense amplifier 32) (avoiding increase in circuit area).

As described above, in the present embodiment, the word line drive section 31 and the bit line drive section/sense amplifier 32 perform the operation of writing information on the memory device 21 by applying the voltage V1 equal to or higher than the predetermined threshold value between the electrodes 215A and 215B of the memory device 21 to be driven of the plurality of memory devices 21 in the memory array 2, and thereby forming the filament 210 in the region between the semiconductor layers 212N and 213N. Accordingly, writing operation is achieved, for example, without adopting a high withstand voltage device as the memory device 21 or without applying a large current upon writing operation. Also, the electrodes 215A and 215C are electrically connected to each other in the memory device 21. Therefore, degradation in disturb characteristics due to the flowing of the leakage current to the outside resulting from the writing operation is suppressed without complicating the circuit configuration. Accordingly, the area of the memory unit 1 (semiconductor unit) is reduced while improving reliability of components such as the memory device 21.

Subsequently, a modification (Modification 1) of the above-described first embodiment will be described. It is to be noted that components similar to those in the first embodiment will be designated with the same numerals and the description thereof will be appropriately omitted.

[Modification 1]

Figure 8:
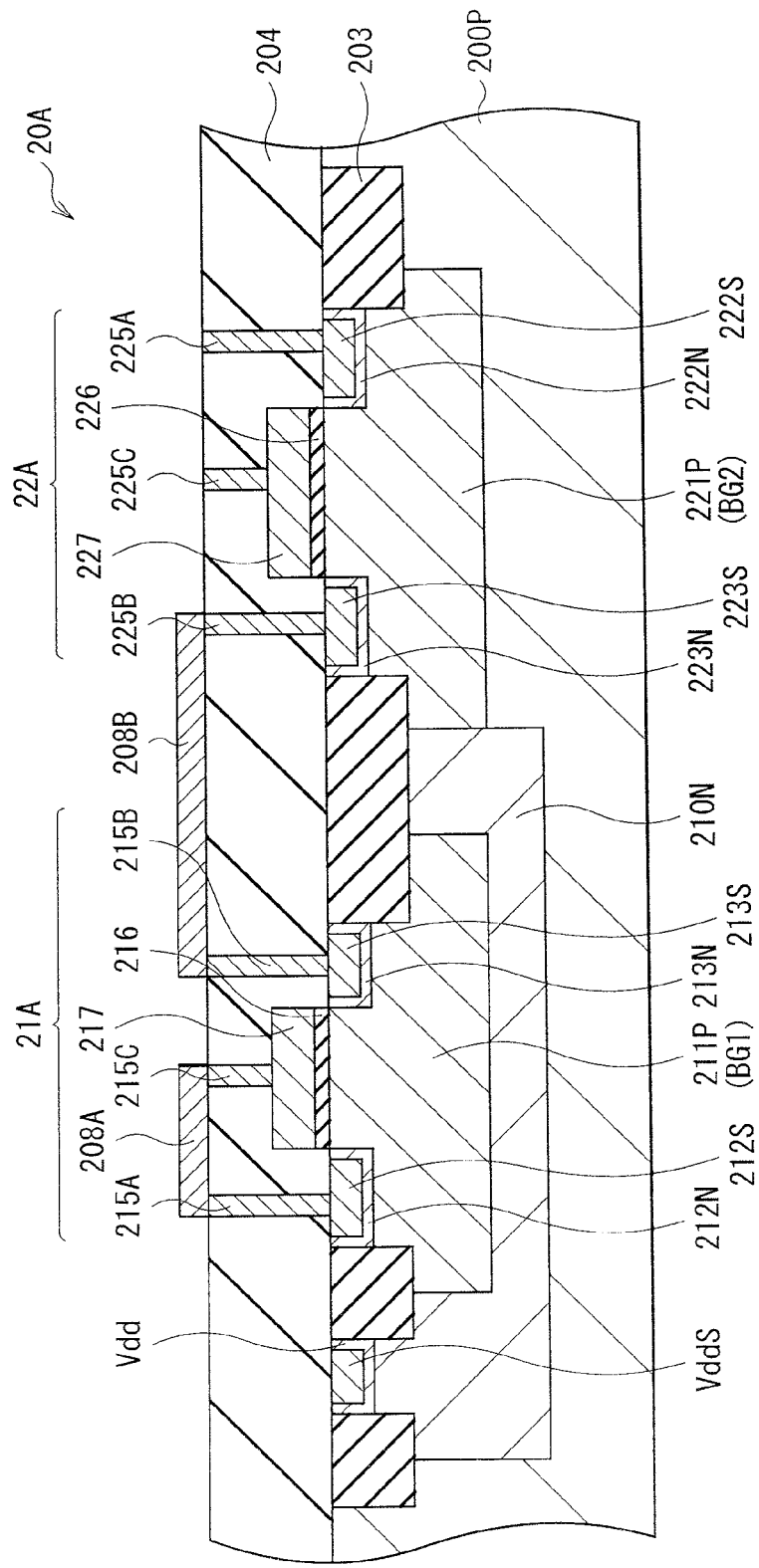
FIG. 8 is a schematic cross-sectional view illustrating a configuration example of a memory cell according to Modification 1.
Figure 9:
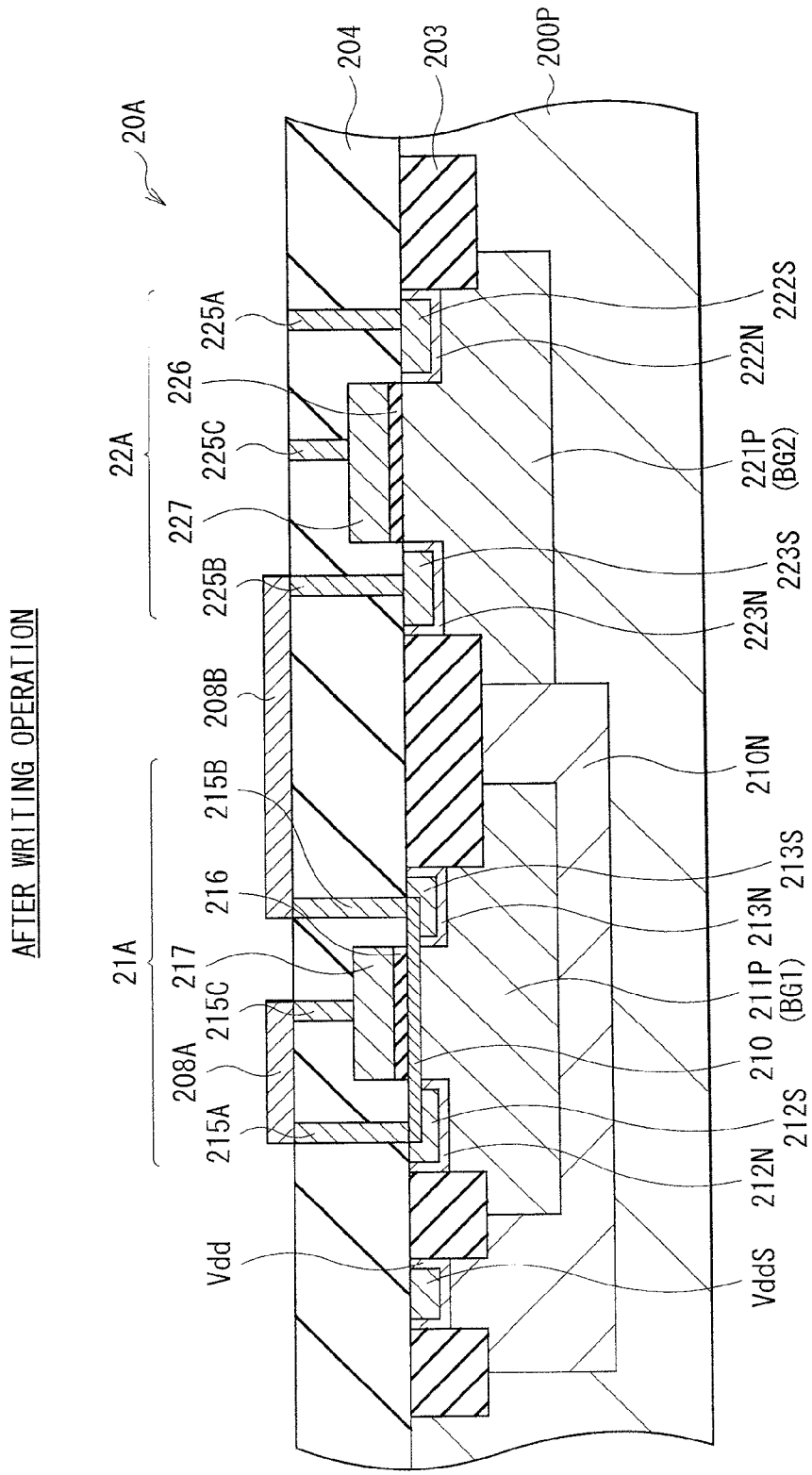
FIG. 9 is a schematic cross-sectional view illustrating a configuration example of a memory cell shown in FIG. 8 after writing operation.

FIGS. 8 and 9 each schematically illustrates a cross-sectional configuration example of a memory cell (memory cell 20A) according to Modification 1. FIG. 8 illustrates a cross-sectional configuration example before writing operation and FIG. 9 illustrates a cross-sectional configuration example after the writing operation. The memory cell 20A according to the present modification includes a memory device 21A and a selection transistor 22A instead of the memory device 21 and the selection transistor 22 in the memory cell 20 in the first embodiment shown in FIGS. 4 and 5.

The memory device 21A includes silicide layers 212S and 213S in the semiconductor layers 212N and 213N, respectively, in the memory device 21, and other configurations are similar to those in the memory device 21. Also, the selection transistor 22A includes silicide layers 222S and 223S in the semiconductor layers 222N and 223N, respectively, in the selection transistor 22, and other configurations are similar to those in the selection transistor 22.

The silicide layers 212S, 213S, 222S, and 223S may each be formed, for example, of silicide metal (silicide using metal with high melting point) such as CoSi and NiSi, and each may be formed by a typical silicidation process.

Also in the present modification, effects similar to those in the first embodiment are basically obtainable from functions similar to those in the first embodiment. However, in the present modification, the filament 210 is formed by one or more of the conductive component configuring the electrode 215A, the conductive component configuring the electrode 215B, and conductive components configuring the silicide layers 212S and 213S, that are moved into the semiconductor layer 211P by migration.

Second Embodiment

Subsequently, a second embodiment of the present disclosure will be described. In the present embodiment, writing operation that utilizes voltages with opposite polarities is performed as will be described below. It is to be noted that components similar to those in the first embodiment and the like will be designated with the same numerals and the description thereof will be appropriately omitted.

[Outline of Writing Operation and Reading Operation]

First, description will be given of writing operation and reading operation of the present embodiment with reference to FIGS. 10A and 10B.

Figure 10A:
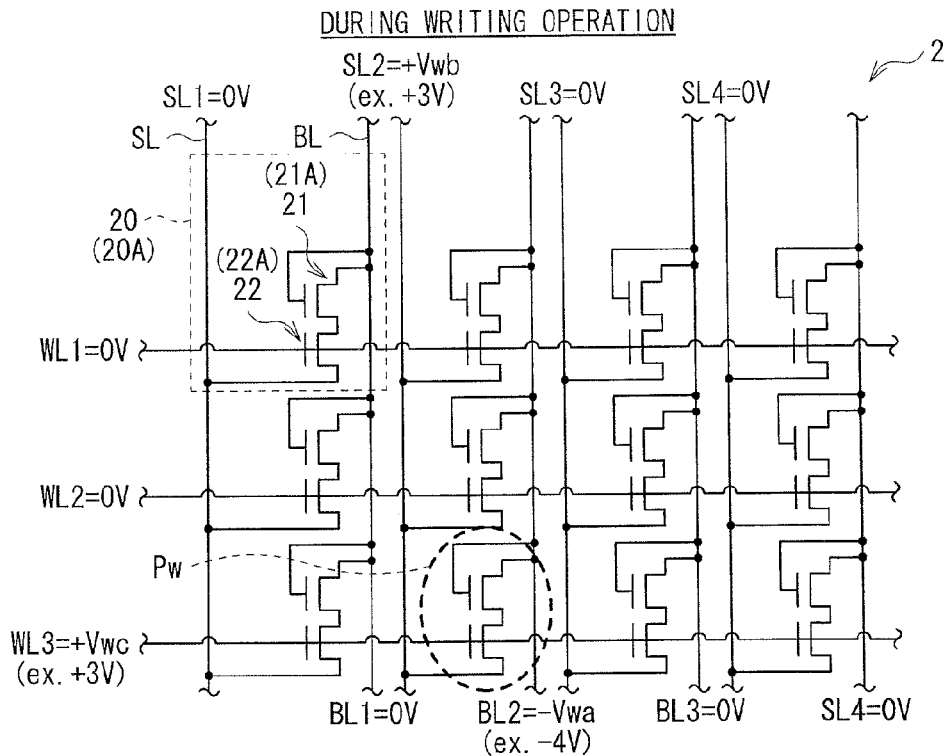
FIGS. 10A and 10B are circuit diagrams for explaining writing operation and reading operation according to a second embodiment.

For example, as shown in FIG. 10A, upon the writing operation of the present embodiment, a writing voltage is applied after selecting, in the following manner, the memory cell 20 to be driven which is shown by a symbol Pw in FIG. 10A. Specifically, the word line drive section 31 selectively applies a voltage (+Vwc; +3 V, for example) with positive polarity to the word line (the word line WL3 in this example) connected to the memory cell 20 to be driven. Also, the bit line drive section/sense amplifier 32 selectively applies a voltage (−Vwa; −4 V, for example) with negative polarity and a voltage (+Vwb; +3 V, for example) with positive polarity to the bit line (the bit line BL2 in this example) and to the reference line (the reference line SL2 in this example), respectively, that are connected to the memory cell 20 to be driven. It is to be noted that, at this time, the ground potential (0 V) is applied to each of the word lines (the word lines WL1, WL2, etc., in this example), the bit lines (the bit lines BL1, BL3, BL4, etc. in this example), and the reference lines (the reference lines SL1, SL3, SL4, etc.) other than those described above.

Figure 10B:
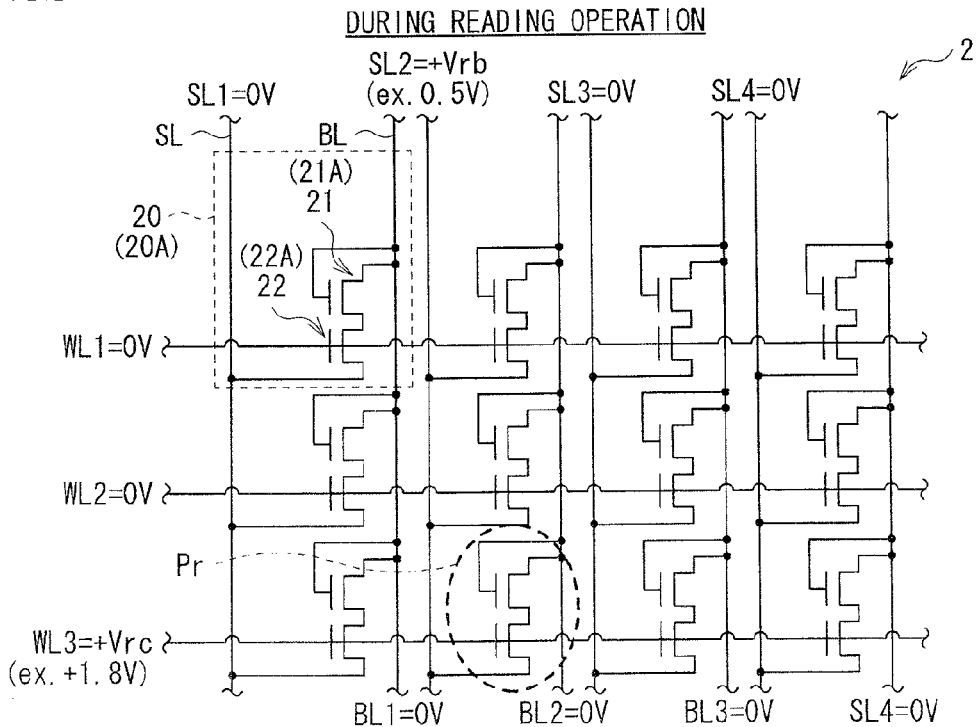

On the other hand, for example, as shown in FIG. 10B, upon the reading operation of the present embodiment, a reading voltage is applied after selecting, in the following manner, the memory cell 20 to be driven shown by a symbol Pr in FIG. 10B. Specifically, the word line drive section 31 selectively applies a voltage (+Vrc; +1.8 V, for example) with positive polarity to the word line (the word line WL3, in this example) connected to the memory cell 20 to be driven. Also, the bit line drive section/sense amplifier 32 selectively applies a voltage (+Vrb; +0.5 V, for example) with positive polarity to the reference line (the reference line SL2, in this example) connected to the memory cell 20 to be driven. It is to be noted that, at this time, the ground potential (0 V) is applied to each of the word lines (the word lines WL1, WL2, etc., in this example), the reference lines (the reference lines SL1, SL3, SL4, etc.) other than those described above, and all of the bit lines (the bit lines BL1 to BL4, etc., in this example).

As described above, the writing operation of the present embodiment is performed utilizing application of voltages (the voltage (+Vwb) with positive polarity applied to the reference line SL and the voltage (−Vwb) with negative polarity applied to the bit line BL) with opposite polarities to the memory cell 20 to be driven. The details of the writing operation will be described below.

[Concerning Details of Writing Operation]

Figure 11:
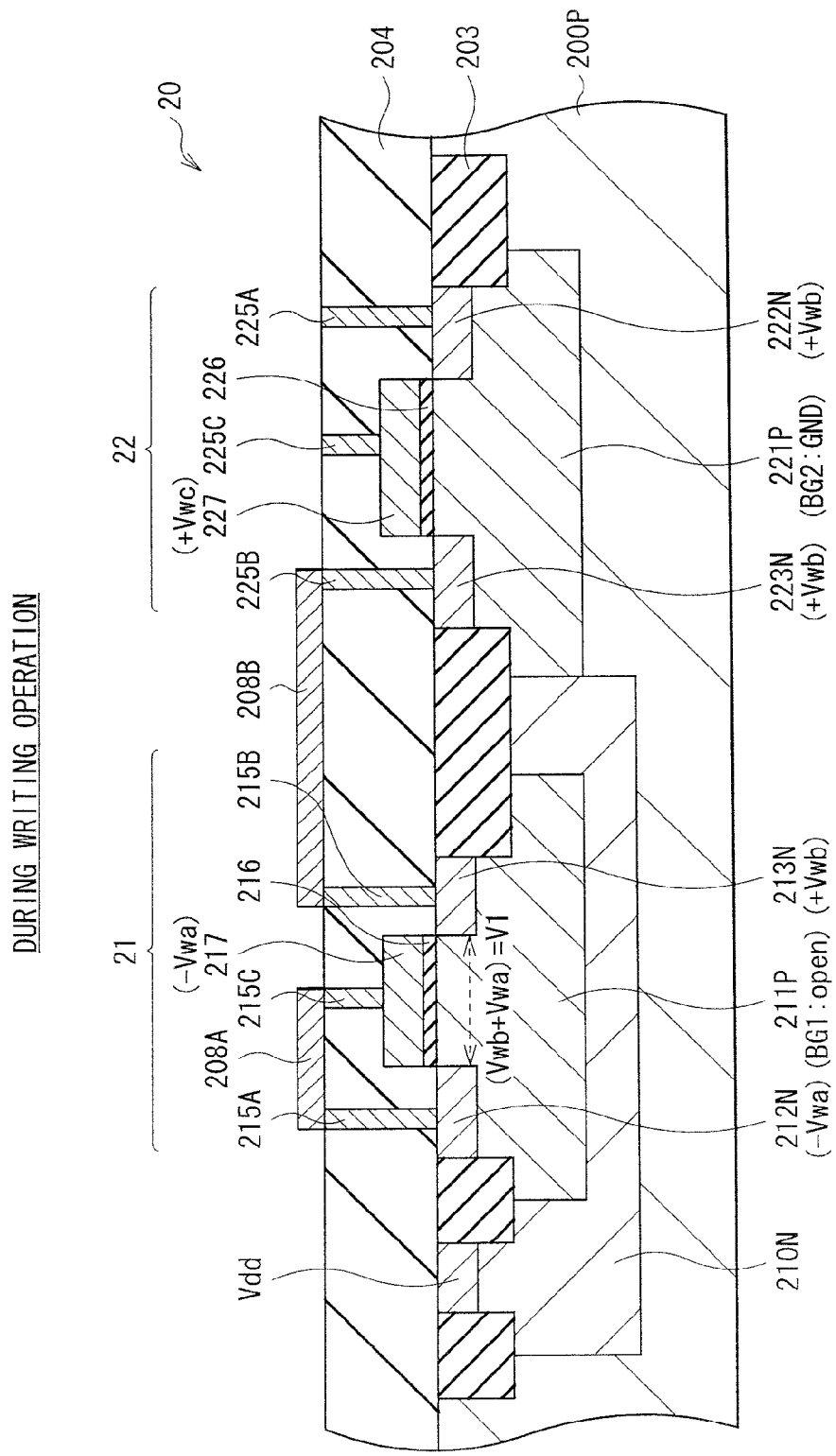
FIG. 11 is a schematic cross-sectional view for explaining the details of the writing operation shown in FIG. 10.

First, for example, as shown in FIG. 11, the following voltages are applied to the electrodes, the semiconductor layers, etc. in the memory device 21 and the selection transistor 22 in the memory cell 20 to be driven upon the writing operation. Specifically, first, the above-described voltage (−Vwa) with negative polarity is applied, through the bit line BL, to the electrode 215A (semiconductor layer 212N) and the electrode 215C (conductive film 217) in the memory device 21. Also, the above-described voltage (+Vwb) with positive polarity is applied to the electrode 225A (semiconductor layer 222N) in the selection transistor 22 through the reference line SL, and the above-described voltage (+Vwc) with positive polarity is applied to the electrode 225C (conductive film 227) in the selection transistor 22 through the word line WL. At this time, the selection transistor 22 is turned on in the memory cell 20 to be driven. Therefore, the potential (+Vwb) of the semiconductor layer 222N is also applied to the semiconductor layer 223N in the selection transistor 22. Further, the potential (+Vwb) with positive polarity is also applied to the semiconductor layer 213N in the memory device 21 from the semiconductor layer 223N through the electrode 225B, the wiring 208B, and the electrode 215B.

As described above, in the memory device 21 in the memory cell 20 to be driven, the selection transistor 22 in the memory cell 20 is turned on, and thereby, voltages with opposite polarities are applied to the respective semiconductor layers 212N and 213N. In particular, the voltage (+Vwb) with positive polarity is applied to the semiconductor layer 213N, and on the other hand, the voltage (−Vwa) with negative polarity is applied to the semiconductor layer 212N. Accordingly, the voltage V1 (the writing voltage for forming the filament 210) equal to or higher than the threshold value described in the first embodiment is generated between the semiconductor layers 212N and 213N in the memory device 21 as shown in FIG. 11. In other words, the voltage (potential difference) V1 necessary upon the writing operation is achieved by sum of an absolute value (Vwb) of the voltage (+Vwb) with positive polarity and an absolute value (Vwa) of the voltage (−Vwa) with negative polarity (V1=(Vwb+Vwa)). In other words, the voltage V1 necessary upon the writing operation is allowed to be separated into the voltage (+Vwb) with positive polarity that is supplied to the selection transistor 22 and the voltage (−Vwa) with negative polarity that is supplied to the memory device 21. Accordingly, the voltage applied to each electrode in the memory device 21 and in the selection transistor 22 is suppressed to a low value, and therefore, the withstand voltages of the components such as the memory device 21 and the selection transistor 22 are set to be low.

Figure 12:
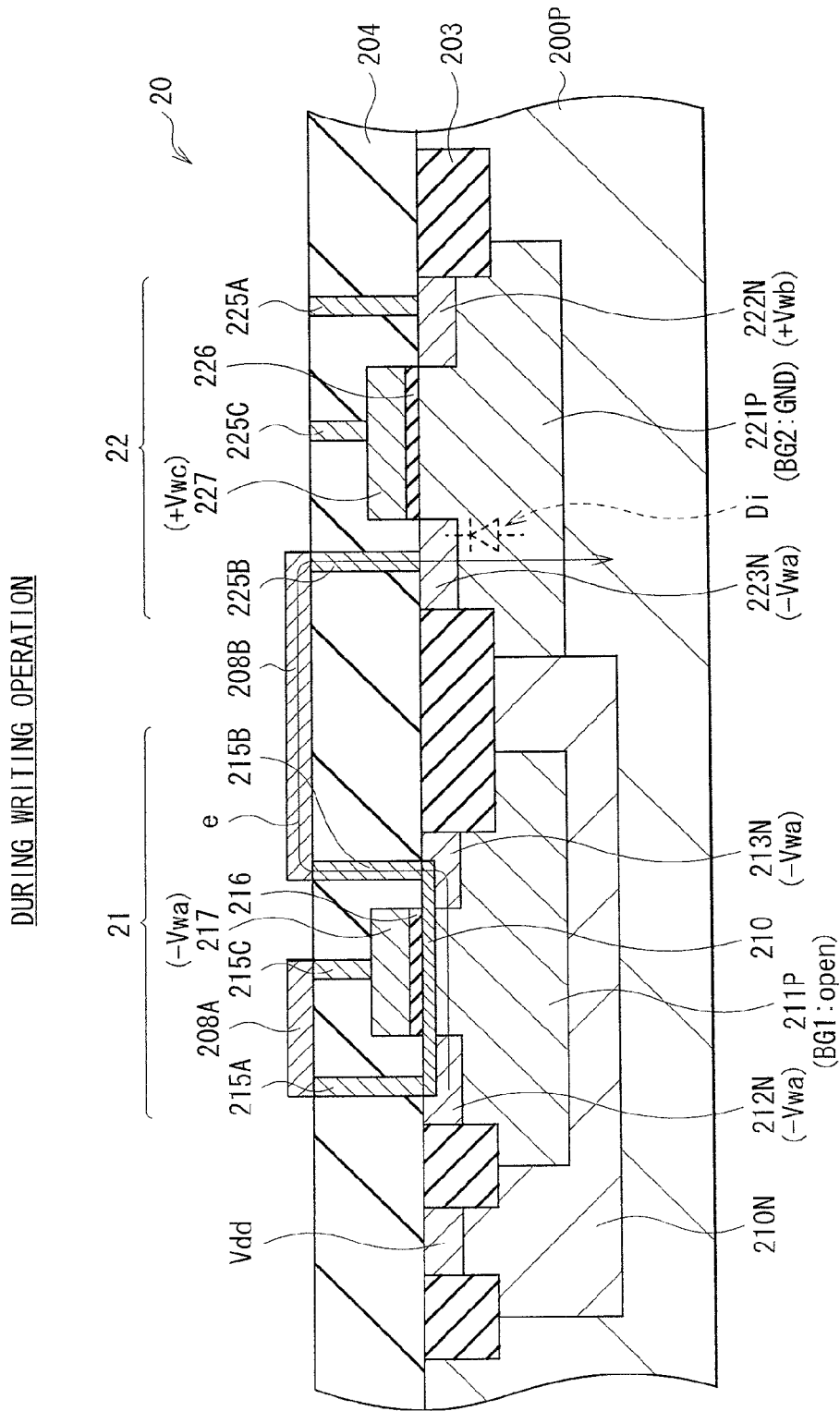
FIG. 12 is a schematic cross-sectional view for explaining operation after a state shown in FIG. 11.

Moreover, when the voltage V1 is thus applied, for example, as shown in FIG. 12, the filament 210 is formed between the semiconductor layers 212N and 213N in the memory device 21 based on the principle described in the first embodiment and the like. At this time, the resistance value of the filament 210 is sufficiently lower than the ON-resistance value of the selection transistor 22. Therefore, the potential of each of the semiconductor layers 213N and 223N becomes a potential same as (a potential substantially the same as) the potential (−Vwa) of the semiconductor layer 212N after the formation of the filament 210 as shown in FIG. 12.

Accordingly, in the memory cell 20 to be driven, a parasitic diode Di resulting from the PN junction that is formed between the semiconductor layer 221P and the semiconductor layer 223N in the selection transistor 22 is turned on in a forward direction, as shown in FIG. 12. Specifically, in this case, the potential (−Vwa) of the semiconductor layer 223N is lower than the potential (GND (0 V)) of the semiconductor layer 221P, and the potential difference Vwa therebetween is larger than the threshold voltage (about 0.7 V) of the parasitic diode Di. Thus, when the filament 210 is formed, a bias condition (polarity and an absolute value of a bias voltage) by which the parasitic diode Di is turned on in the forward direction is set. Therefore, as shown in FIG. 12, an electron e moves toward the semiconductor layer 221P (toward the GND) through the parasitic diode Di upon the writing operation. In particular, most of the current (write current) that flows during the writing operation is passed from the semiconductor layer 223N not toward the semiconductor layer 222N but toward the GND (escapes toward the GND). In other words, the write current (a large current of about several mA) is applied using not only the transistor 22, and most components of the write current are allowed to be passed toward the GND with use of the parasitic diode Di. Therefore, current ability (driving ability to pass the write current therethrough without being destroyed) necessary in the selection transistor 22 is allowed to be low.

As described above, in the present embodiment, writing operation that utilizes voltages with opposite polarities is performed. Therefore, the withstand voltages of the components such as the memory device 21 and the selection transistor 22 are each set at a low value, and the current ability necessary in the selection transistor 22 is suppressed to be low. Accordingly, the area of the memory unit 1 (semiconductor unit) is further reduced without providing a special manufacturing step.

It is to be noted that the silicide layers 212S, 213S, 222S, and 223S may be provided in the semiconductor layers 212N, 213N, 222N, and 223N, respectively, also in the present embodiment as in the above-described Modification 1.

Subsequently, modifications (Modifications 2 to 4) of the above-described second embodiment will be described. It is to be noted that components similar to those in the second embodiment will be designated with the same numerals and the description thereof will be appropriately omitted.

[Modification 2]

[Configuration of Memory Cell 20B]

Figure 13:
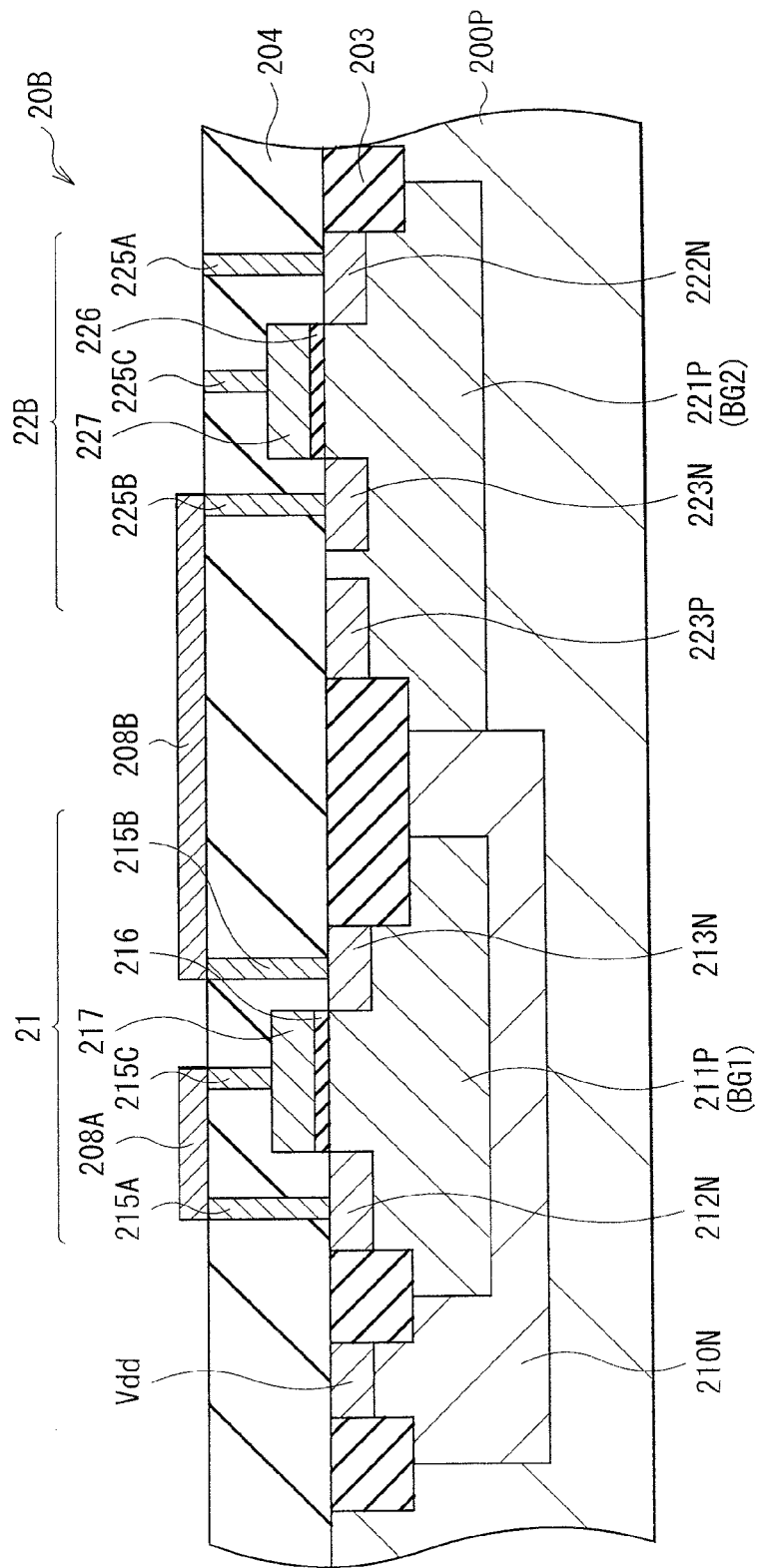
FIG. 13 is a schematic cross-sectional view illustrating a configuration example of a memory cell according to Modification 2.
Figure 14:
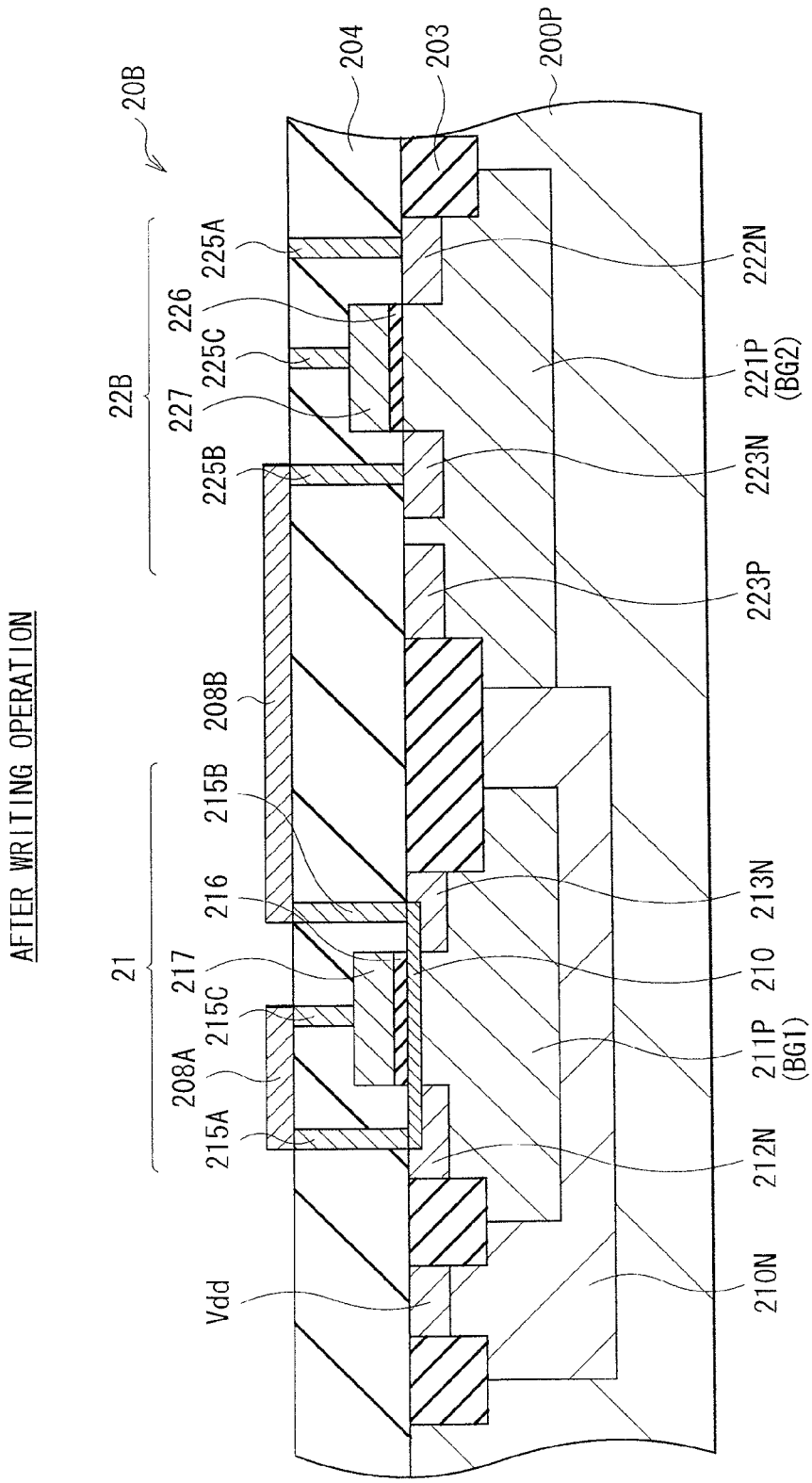
FIG. 14 is a schematic cross-sectional view illustrating a configuration example of a memory cell shown in FIG. 13 after writing operation.

FIGS. 13 and 14 each schematically illustrate a cross-sectional configuration example of a memory cell (memory cell 20B) according to Modification 2. FIG. 13 illustrates a cross-sectional configuration example before writing operation and FIG. 14 illustrates a cross-sectional configuration example after the writing operation. The memory cell 20B of the present modification includes a selection transistor 22B instead of the selection transistor 22 in the memory cell 20 in the first embodiment shown in FIGS. 4 and 5.

The selection transistor 22B includes a semiconductor layer 223P in a vicinity of the semiconductor layer 223N in the semiconductor layer 221P in the selection transistor 22, and other configurations are similar to those of the selection transistor 22. Here, as an example, the semiconductor layer 223P is provided being separated from the semiconductor layer 223N in a region between the semiconductor layer 223N and the device separation section 203 in the semiconductor layer 221P. It is to be noted that a distance between the semiconductor layers 223N and 223P is preferably sufficiently large in a degree that the distance does not influence a junction withstand voltage between the semiconductor layer 223N and the semiconductor layer 221P.

The semiconductor layer 223P is a P-type semiconductor layer and may be made, for example, of a semiconductor material in which, for example, Si or the like is doped with an impurity such as B. Also, the semiconductor layer 223P includes an impurity injected thereto that has higher density compared to the semiconductor layer 221P (the back gate BG2) of the same P type, and is set at the ground potential (GND) in this example. Accordingly, the semiconductor layer 223P functions as a current extracting section that locally extracts a write current that flows between the memory device 21 and the selection transistor 22B upon the writing operation as will be described below.

[Writing Operation in Memory Cell 20B]

Figure 15:
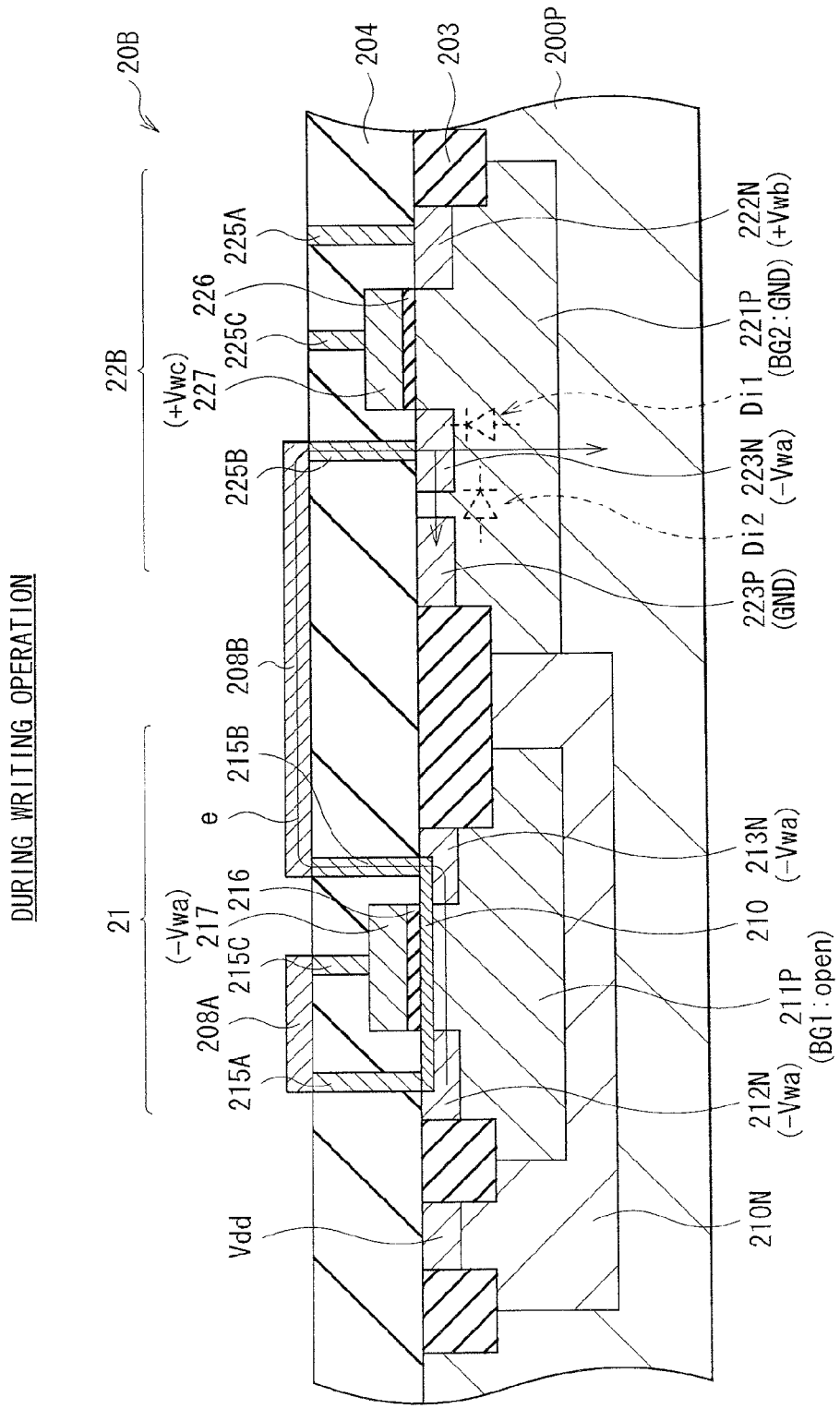
FIG. 15 is a schematic cross-sectional view for explaining writing operation in the memory cell shown in FIG. 13.

As shown in FIGS. 14 and 15, the filament 210 is basically formed by a method similar to that in the second embodiment, and thereby, writing operation on the memory device 21 is performed also in the memory cell 20B of the present modification.

However, in the present modification, the following functions are obtained since the above-described semiconductor layer (current extracting section) 223P is provided in the semiconductor layer 221P. That is, for example, as shown in FIG. 15, the write current (electron e) flows not only toward a parasitic diode Di1 that is formed between the semiconductor layers 221P and 223N but also toward a parasitic diode Di2 that is formed between the semiconductor layers 221P and 223P. In other words, the write current flows from the semiconductor layer 223N toward both the semiconductor layer 221P (the back gate BG2; GND) and the semiconductor layer 223P (the current extracting section; GND). Therefore, in the present modification, more current paths of the write current are provided, and thereby, the write current efficiently escapes toward the GND. Accordingly, an area of the selection transistor 22B is further reduced, and thereby, the area of the memory unit 1 (semiconductor unit) is further reduced.

It is to be noted that the silicide layers 212S, 213S, 222S, and 223S may be provided in the semiconductor layers 212N, 213N, 222N, and 223N, respectively, also in the present modification as in the above-described Modification 1.

[Modification 3]
[Configuration of Memory Cell 20C]

Figure 16:
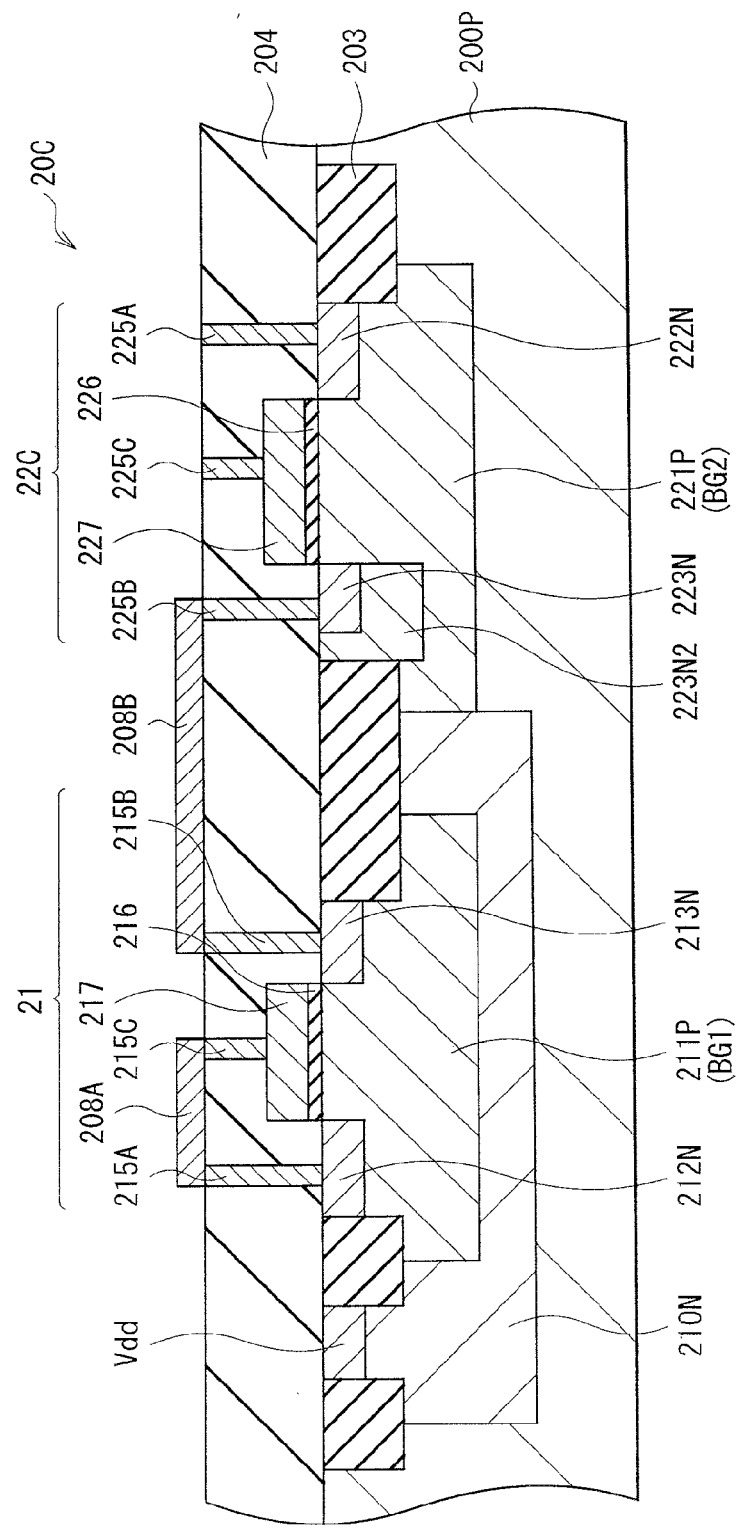
FIG. 16 is a schematic cross-sectional view illustrating a configuration example of a memory cell according to Modification 3.

FIG. 16 schematically illustrates a cross-sectional configuration example (cross-sectional configuration example before writing operation) of a memory cell (memory cell 20C) according to Modification 3. The memory cell 20C of the present modification includes a selection transistor 22C instead of the selection transistor 22 in the memory cell 20 in the first embodiment shown in FIG. 4.

The selection transistor 22C includes a diffusion layer 223N2 around the semiconductor layer 223N in the semiconductor layer 221P in the selection transistor 22, and other configurations are similar to those in the selection transistor 22. Here, as an example, the diffusion layer 223N2 is so provided as to surround the semiconductor layer 223N in the semiconductor layer 221P. It is to be noted that a formation region of the diffusion layer 223N2 is desirably provided not to extend out from a formation region of the semiconductor layer 223N toward the semiconductor layer 222N in order not to lower an isolation withstand voltage between the semiconductor layers 223N and 222N.

The diffusion layer 223N2 is formed of an N-type semiconductor layer, and may be made, for example, of a semiconductor layer in which, for example, Si or the like is doped with an impurity such as As and P. Also, the diffusion layer 223N2 includes an impurity injected thereto that has lower density compared to the semiconductor layer 223N of the same N type. The provision of such a diffusion layer 223N2 expands a junction area (an area of the PN junction) in the parasitic diode Di that is formed between the semiconductor layers 221P and 223N. It is to be noted that the diffusion layer 223N2 is preferably formed without providing an additional step, for example, by using an existing step.

[Writing Operation in Memory Cell 20C]

Figure 17:
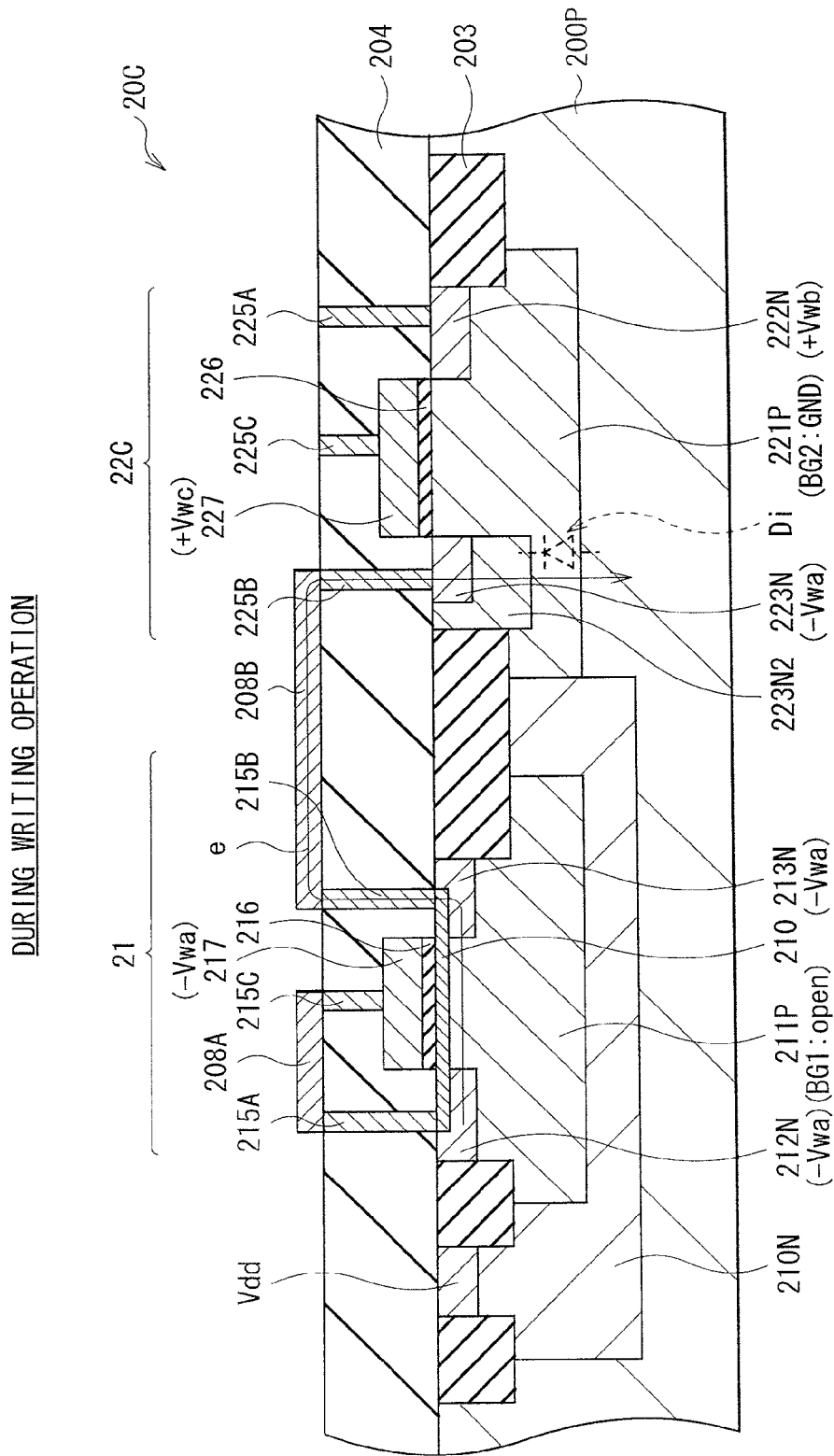
FIG. 17 is a schematic cross-sectional view for explaining writing operation in a memory cell shown in FIG. 16.

As shown in FIG. 17, the filament 210 is basically formed by a method similar to that in the second embodiment, and thereby, writing operation on the memory device 21 is performed also in the memory cell 20C of the present modification.

However, in the present modification, the following functions are also obtained since the above-described diffusion layer 223N2 is provided in the semiconductor layer 221P. That is, the junction area in the parasitic diode Di that is formed between the semiconductor layers 221P and 223N expands as described above, and therefore, a threshold voltage Vf of the parasitic diode Di becomes smaller. Accordingly, the parasitic diode Di is turned on more easily (performs forward-direction operation more easily). Therefore, the write current (electron e) is efficiently passed (escapes) toward the GND (toward the semiconductor layer 221P). Accordingly, an area of the selection transistor 22C is further reduced, and thereby, the area of the memory unit 1 (semiconductor unit) is further reduced.

It is to be noted that the silicide layers 212S, 213S, 222S, and 223S may be provided in the semiconductor layers 212N, 213N, 222N, and 223N, respectively, also in the present modification as in the above-described Modification 1.

[Modification 4]
[Configuration of Memory Cell 20D]

Figure 18:
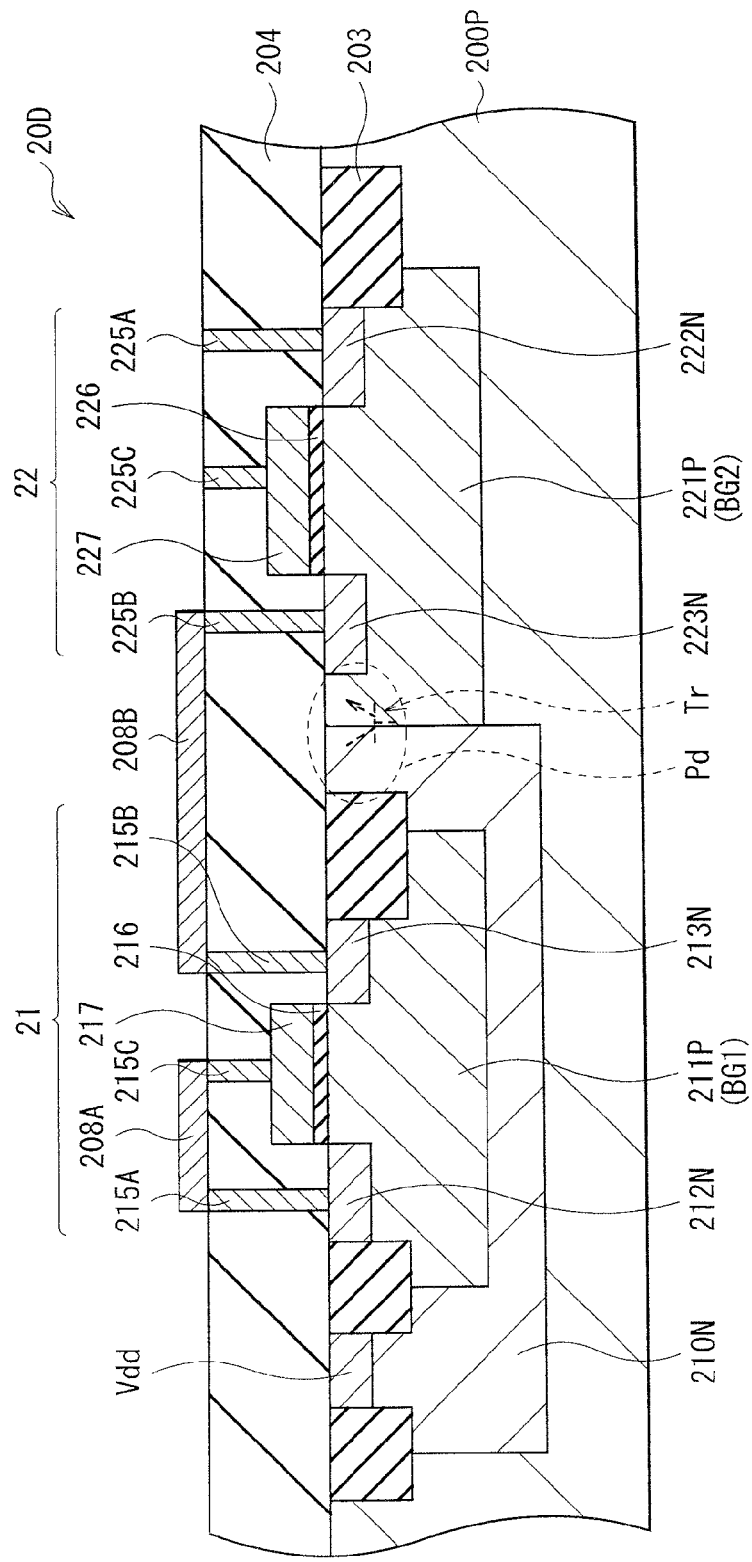
FIG. 18 is a schematic cross-sectional view illustrating a configuration example of a memory cell according to Modification 4.

FIG. 18 schematically illustrates a cross-sectional configuration example (a cross-sectional configuration example before writing operation) of a memory cell (memory cell 20D) according to Modification 4. The memory cell 20D in the present modification does not include the device separation section 203 in part of the region between the memory device 21 and the selection transistor 22 in the memory cell 20 in the first embodiment shown in FIG. 4.

Specifically, the device separation section 203 is not formed in a region including the semiconductor layer 221P and a part of the semiconductor layer 210N in the region between the semiconductor layers 223N and 213N in this example (see a symbol Pd in FIG. 18). Thus, as shown in FIG. 18, an NPN-type bipolar transistor Tr is formed along a lateral direction (in-layer direction) with the semiconductor layer 223N (emitter), the semiconductor layer 221P (base), and the semiconductor layer 210N (collector) in the region between the semiconductor layers 223N and 213N.

[Writing Operation in Memory Cell 20D]

Figure 19:
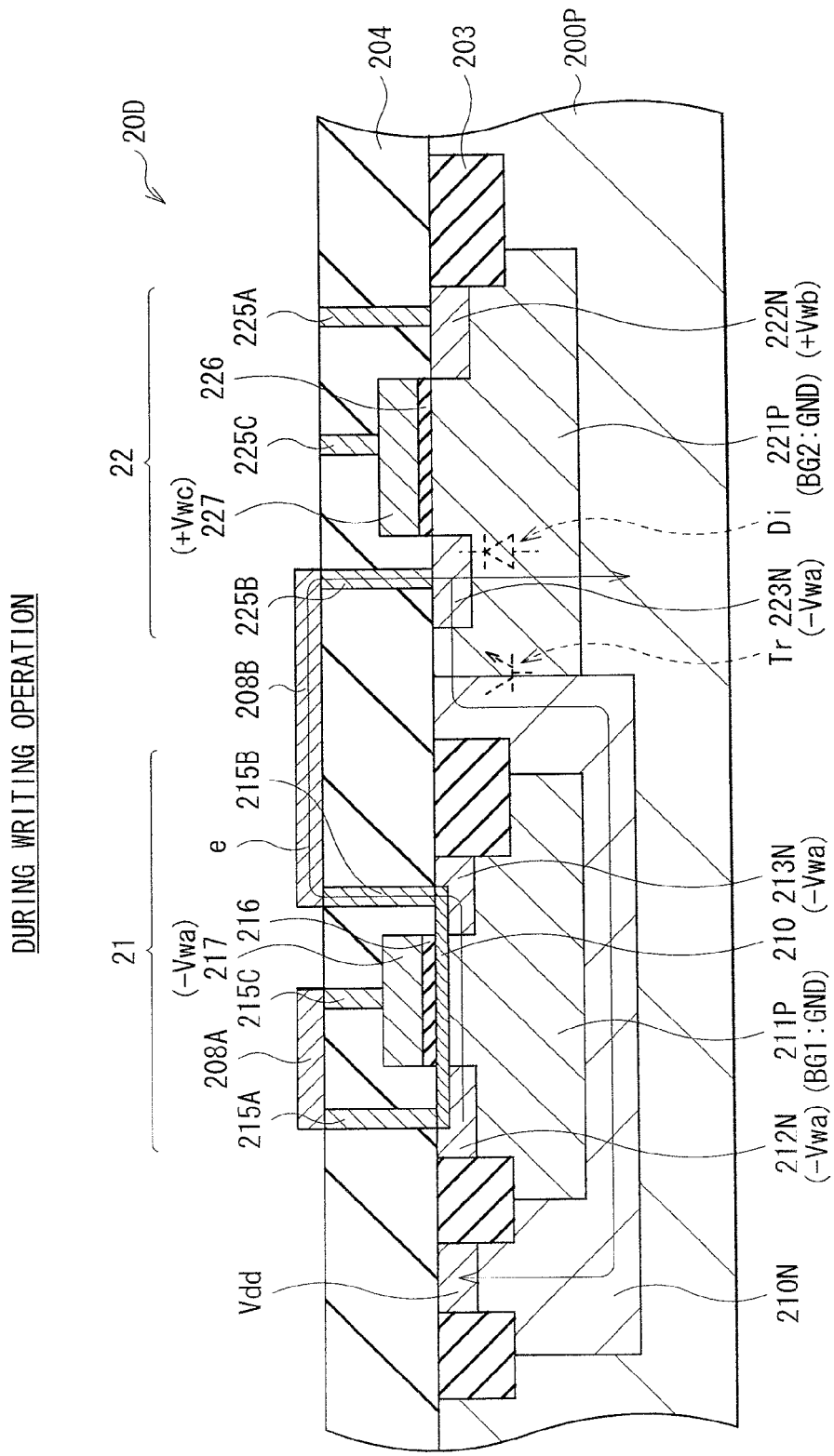
FIG. 19 is a schematic cross-sectional view for explaining writing operation in a memory cell shown in FIG. 18.

As shown in FIG. 19, the filament 210 is basically formed by a method similar to that in the second embodiment, and thereby, writing operation on the memory device 21 is performed also in the memory cell 20D of the present modification.

However, in the present modification, the following functions are also obtained since the above-described NPN-type bipolar transistor Tr is formed in the semiconductor layer 221P. That is, the bipolar transistor Tr operates upon the writing operation, and thereby, for example, as shown in FIG. 19, the write current (electron e) flows not only toward the parasitic diode Di1 that is formed between the semiconductor layers 221P and 223N but also toward the bipolar transistor Tr. In other words, the write current flows from the semiconductor layer 223N not only toward the semiconductor layer 221P (the back gate BG2; GND) but also toward the semiconductor layer 210N (the back gate BG1; GND) through the bipolar transistor Tr. Therefore, in the present modification, more current paths of the write current are provided, and thereby, the write current efficiently escapes toward the GND. Accordingly, the area of the selection transistor 22 is further reduced, and thereby, the area of the memory unit 1 (semiconductor unit) is further reduced.

It is to be noted that the silicide layers 212S, 213S, 222S, and 223S may be provided in the semiconductor layers 212N, 213N, 222N, and 223N, respectively, also in the present modification as in the above-described Modification 1.

Third Embodiment

Subsequently, a third embodiment of the present disclosure will be described. In the present embodiment, writing operation that does not utilize voltages with opposite polarities (voltage with negative polarity) is performed, unlike in the second embodiment. It is to be noted that components similar to those in the second embodiment and the like will be designated with the same numerals and the description thereof will be appropriately omitted.

[Writing Operation]

First, in the writing operation in the present embodiment, a potential of "+Vwa" is added to a value of the voltage applied to each of the electrodes and the like upon the writing operation that utilizes voltages with opposite polarities described in the second embodiment, so that a part with the potential (−Vwa) with negative polarity becomes 0 V.

Figure 20:
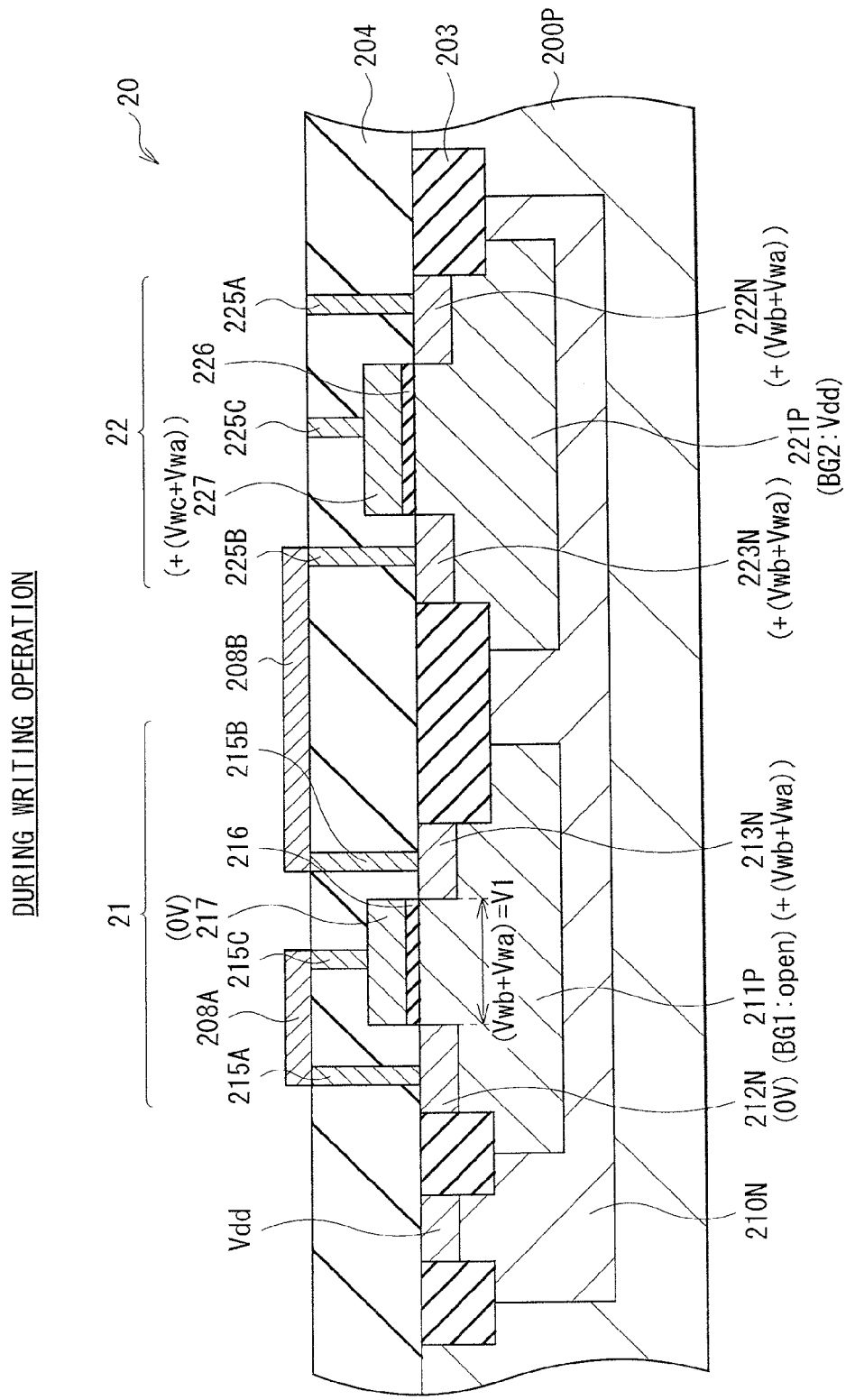
FIG. 20 is a schematic cross-sectional view for explaining writing operation according to a third embodiment.

Specifically, for example, as shown in FIG. 20, in the memory cell 20 to be driven, the following voltages are applied to the respective electrodes, the respective semiconductors, and the like in the memory device 21 and the selection transistor 22 upon the writing operation in the present embodiment. First, 0 V (=(−Vwa)+Vwa) is applied to each of the electrode 215A (semiconductor layer 212N) and the electrode 215C (conductive film 217) in the memory device 21 through the bit line BL as described above. Also, a voltage (+(Vwb+Vwa)) with positive polarity is applied to the electrode 225A (semiconductor layer 222N) in the selection transistor 22 through the reference line SL, and a voltage (+(Vwc+Vwa)) with positive polarity is applied to the electrode 225C (conductive film 227) in the selection transistor 22 through the word line WL. At this time, the selection transistor 22 is turned on in the memory cell 20 to be driven. Therefore, the potential (+(Vwb+Vwa)) of the semiconductor layer 222N is applied also to the semiconductor layer 223N in the selection transistor 22. Further, the potential (+(Vwb+Vwa)) with positive polarity is applied also to the semiconductor layer 213N in the memory device 21 from the semiconductor layer 223N through the electrode 225B, the wiring 208B, and the electrode 215B.

As described above, in the memory device 21 in the memory cell 20 to be driven, the selection transistor 22 in the memory cell 20 is turned on, and thereby, voltages with opposite polarities (voltage with negative polarity) are not allowed to be applied between the semiconductor layers 212N and 213N. In particular, a voltage (+(Vwb+Vwa)) with positive polarity is applied to the semiconductor layer 213N, and on the other hand, 0 V is applied to the semiconductor layer 212N. Accordingly, as shown in FIG. 20, the voltage V1 (the writing voltage for forming the filament 210) equal to or higher than the threshold value described in the first embodiment is generated between the semiconductor layers 212N and 213N in the memory device 21. In other words, the voltage (potential difference) V1 necessary upon the writing operation is achieved by sum of an absolute value (Vwb+Vwa) of the voltage (+(Vwb+Vwa)) with positive polarity and 0 V (V1=(Vwb+Vwa)).

Figure 21:
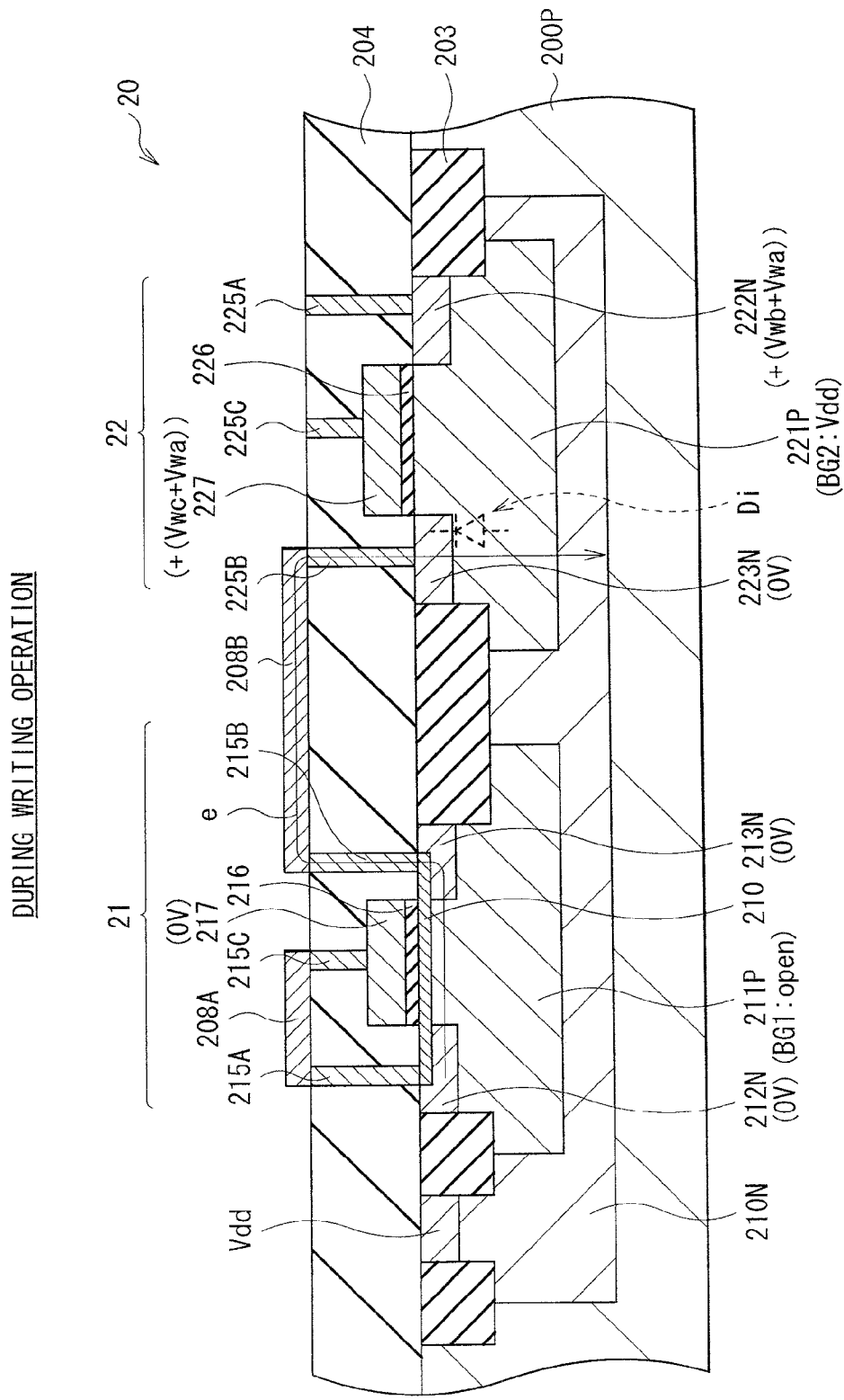
FIG. 21 is a schematic cross-sectional view for explaining operation after a state shown in FIG. 20.

Moreover, when the voltage V1 is thus applied, for example, as shown in FIG. 21, the filament 210 is formed between the semiconductor layers 212N and 213N in the memory device 21 based on the principle described in the first embodiment and the like. At this time, the resistance value of the filament 210 is sufficiently lower than the ON-resistance value of the selection transistor 22. Therefore, the potential of each of the semiconductor layers 213N and 223N becomes a potential same as (a potential substantially the same as) the potential (0 V) of the semiconductor layer 212N after the formation of the filament 210 as shown in FIG. 21.

Accordingly, in the memory cell 20 to be driven, the parasitic diode Di resulting from the PN junction that is formed between the semiconductor layer 221P and the semiconductor layer 223N in the selection transistor 22 is turned on in the forward direction, as shown in FIG. 21. Specifically, in this case, the potential (0 V) of the semiconductor layer 223N is lower than the potential (Vdd) of the semiconductor layer 221P, and the potential difference Vdd therebetween is larger than the threshold voltage (about 0.7 V) of the parasitic diode Di. Thus, when the filament 210 is formed, the bias condition (the polarity and the absolute value of the bias voltage) by which the parasitic diode Di is turned on in the forward direction is set. Therefore, as shown in FIG. 21, an electron e moves toward the semiconductor layer 221P (toward the Vdd) through the parasitic diode Di upon the writing operation. Specifically, most of the current (write current) that flows during the writing operation is passed from the semiconductor layer 223N not toward the semiconductor layer 222N but toward the Vdd (escapes toward the Vdd). In other words, the write current (a large current of about several mA) is applied using not only the transistor 22, and most components of the write current is allowed to be passed toward the Vdd with use of the parasitic diode Di. Therefore, current ability (driving ability to pass the write current therethrough without being destroyed) necessary in the selection transistor 22 is allowed to be low.

As described above, in the present embodiment, writing operation is performed as in the second embodiment and the like and similar effects are obtained without utilizing voltages with opposite polarities (voltage with negative polarity). In other words, the current ability necessary in the selection transistor 22 is suppressed to be low. Accordingly, the area of the memory unit 1 (semiconductor unit) is further reduced without providing a special manufacturing step.

It is to be noted that, in the writing operation in the present embodiment, the voltage V1 necessary upon the writing operation is not separated by the selection transistor 22 and the memory device 21, unlike in the second embodiment, since the writing operation in the present embodiment does not utilize voltages with opposite polarities (voltage with negative polarity) as described above. Therefore, in the present embodiment, a voltage applied to each of the electrodes in the memory device 21 and in the selection transistor 22 is higher than that in the second embodiment. Therefore, it is preferable to set the withstand voltage in each of the components such as the memory device 21 and the selection transistor 22 to be high. In this point of view, the semiconductor layer 210N that functions as DNW is formed continuously from the memory device 21 side to the selection transistor 22 side (is so formed that the semiconductor layer 221P is surrounded by the semiconductor layer 210N) in the memory cell 20 shown in FIGS. 20 and 21. In other words, the selection transistor 22 shown in FIGS. 20 and 21 has a triple-well structure as the memory device 21. However, the selection transistor 22 may have a twin-well structure also in the present embodiment as in the description hereinabove.

It is to be noted that the silicide layers 212S, 213S, 222S, and 223S may be provided in the semiconductor layers 212N, 213N, 222N, and 223N, respectively, also in the present embodiment as in the above-described Modification 1.

Moreover, one or more of the configurations in the above-described Modifications 2 to 4 may be adopted in combination with the present embodiment.

Fourth Embodiment

Subsequently, a fourth embodiment of the present disclosure will be described. The present embodiment has a configuration in which wiring connection (electric connection) between the electrodes 215A and 215C is not performed in the memory device, unlike the above-described embodiments and the like. It is to be noted that components similar to those in the first embodiment and the like will be designated with the same numerals and the description thereof will be appropriately omitted.

[Configuration of Memory Cell 20E]

Figure 22:
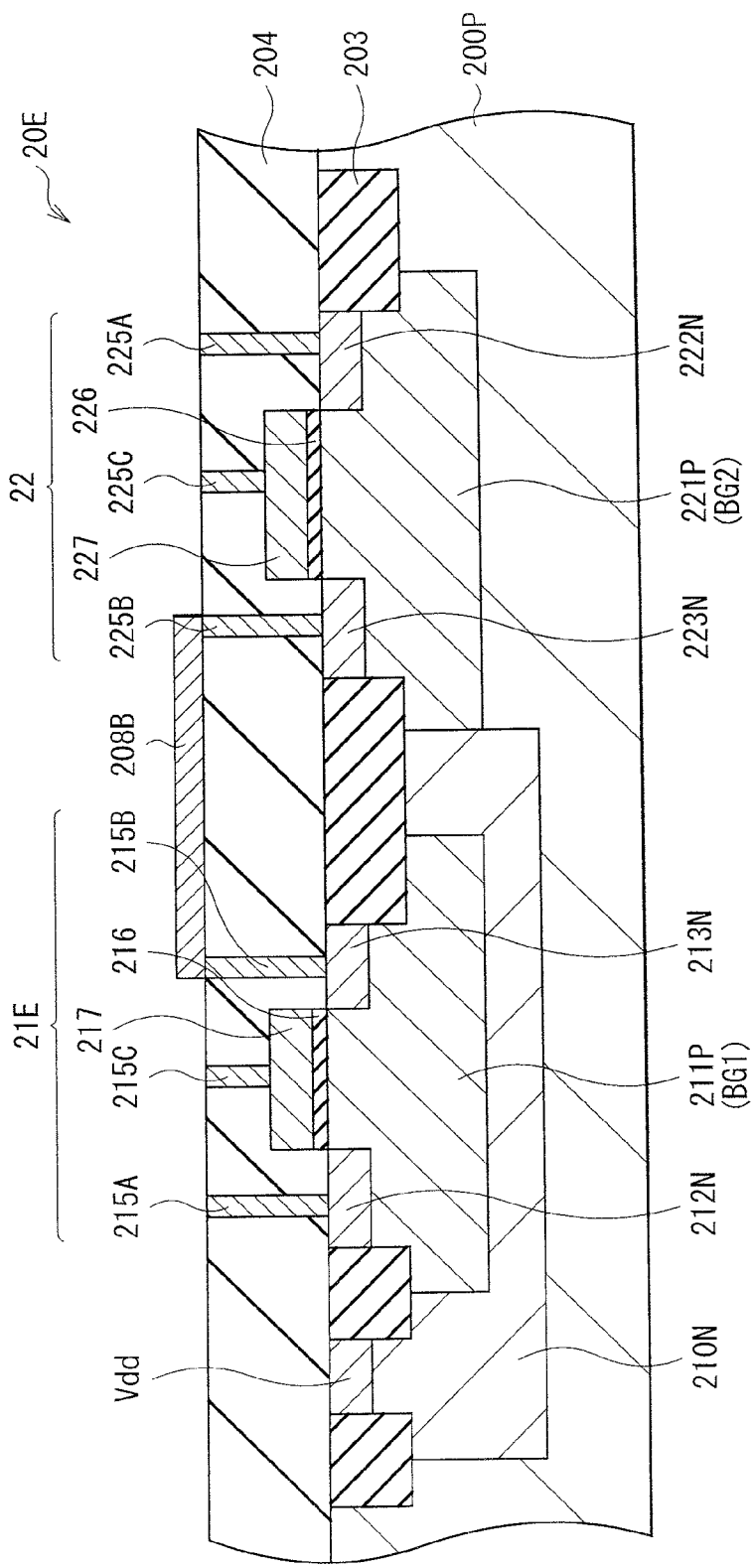
FIG. 22 is a schematic cross-sectional view illustrating a configuration example of a memory cell according to a fourth embodiment.
Figure 23:
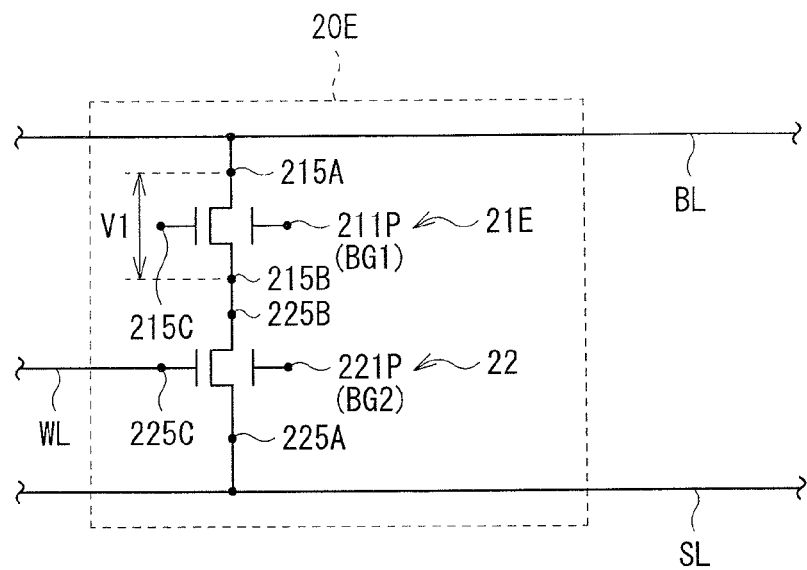
FIG. 23 is a circuit diagram illustrating a configuration example of a memory cell shown in FIG. 22.

FIG. 22 schematically illustrates a cross-sectional configuration example (a cross-sectional configuration example before writing operation) of a memory cell (memory cell 20E) according to the present embodiment. FIG. 23 illustrates a circuit configuration example of the memory cell 20E. The memory cell 20E in the present embodiment includes a memory device 21E instead of the memory device 21 in the memory cell 20 in the first embodiment shown in FIG. 4.

The memory device 21E does not include the wiring 208A in the memory device 21, and has the above-described configuration in which the wiring connection (electric connection) between the electrodes 215A and 215C is not performed. Other configurations of the memory device 21E are similar to those in the memory device 21.

[Writing Operation in Memory Cell 20E]

Figure 24:
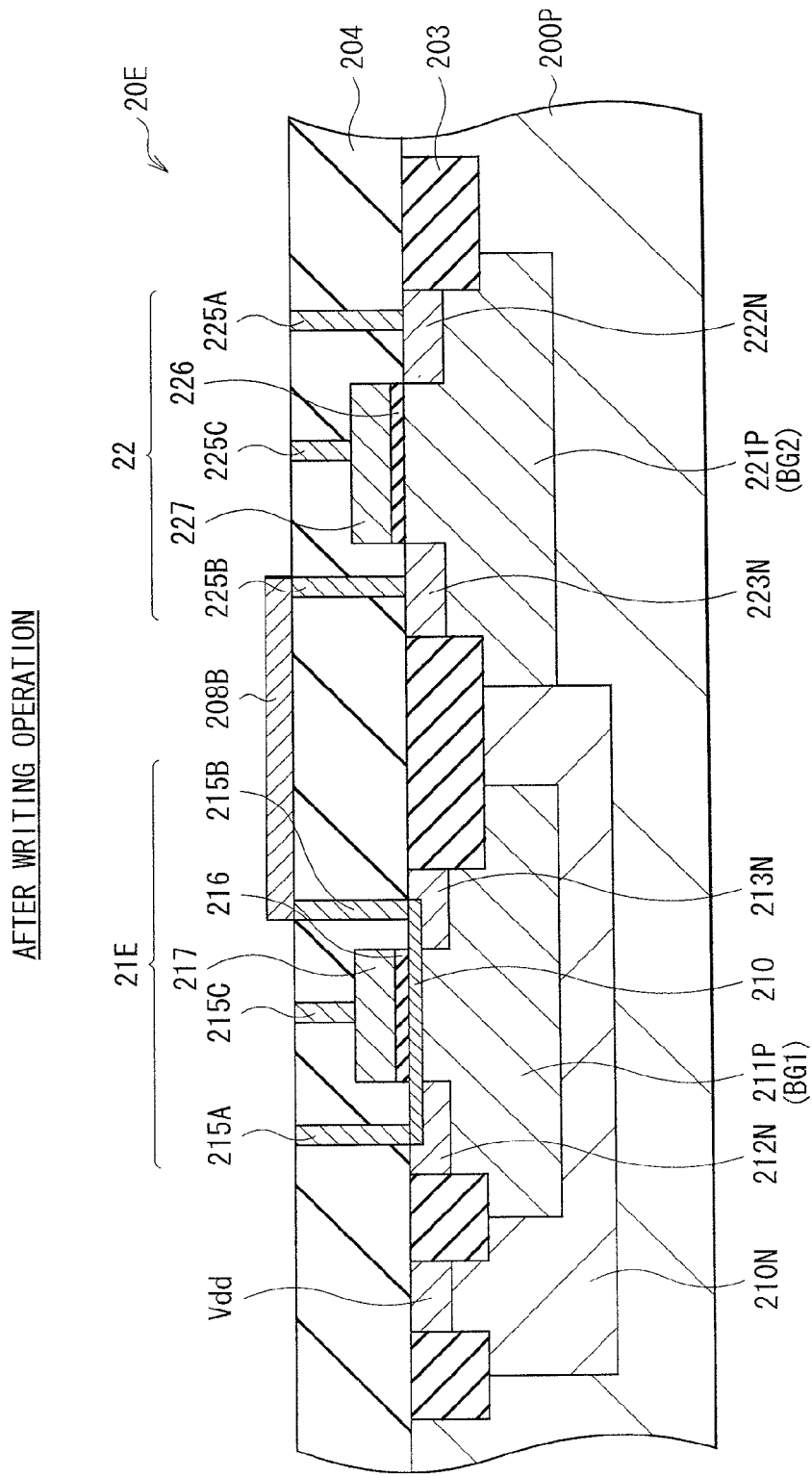
FIG. 24 is a schematic cross-sectional view illustrating a configuration example of a memory cell shown in FIG. 22 after writing operation.

As shown in FIG. 24, the filament 210 is basically formed by a method similar to that in the above-described embodiments, and thereby, writing operation on the memory device 21E is performed also in the memory cell 20E of the present embodiment. Therefore, also in the present embodiment, effects similar to those in the above-described embodiments and the like are obtained from functions similar to those in the above-described embodiments and the like.

In particular, when a method (of performing writing operation that utilizes voltages with opposite polarities) similar to that in the second embodiment (and Modifications 2 to 4) is adopted, the withstand voltages of the components such as the memory device 21E and the selection transistor 22 are set low, and thereby, area reduction is further achieved.

It is to be noted that the silicide layers 212S, 213S, 222S, and 223S may be provided in the semiconductor layers 212N, 213N, 222N, and 223N, respectively, also in the present embodiment as in the above-described Modification 1.

Moreover, one or more of the configurations in the above-described Modifications 2 to 4 may be adopted in combination with the present embodiment.

Fifth Embodiment

Subsequently, a fifth embodiment of the present disclosure will be described. The present embodiment has a configuration in which the conductivity types (P type and N type) of the semiconductor layers in the memory device and in the selection transistor are in a relationship opposite to that in the above-described embodiments and the like. It is to be noted that components similar to those in the first embodiment and the like will be designated with the same numerals and the description thereof will be appropriately omitted.

[Configuration of Memory Cell 20F]

Figure 25:
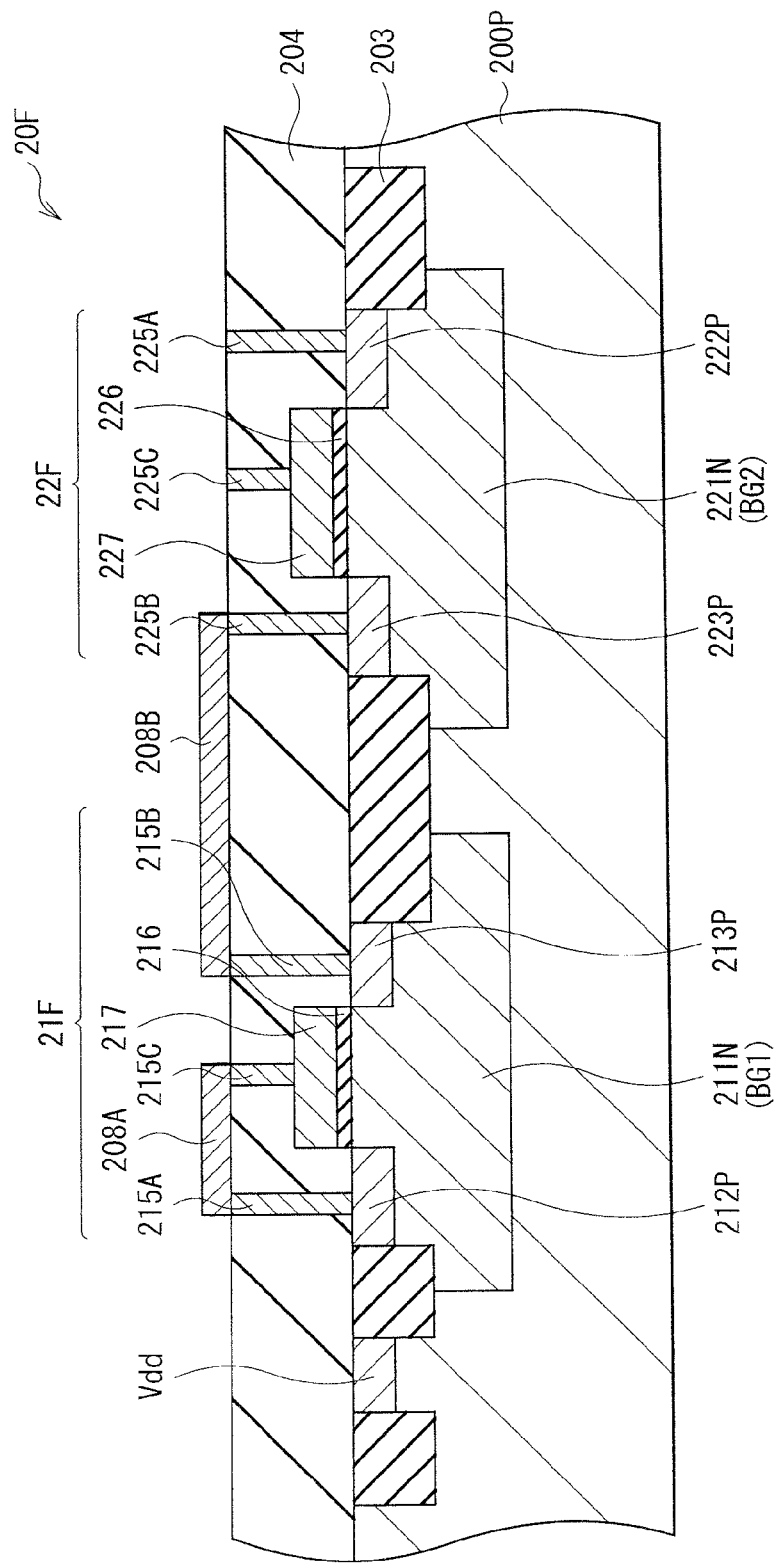
FIG. 25 is a schematic cross-sectional view illustrating a configuration example of a memory cell according to a fifth embodiment.
Figure 26:
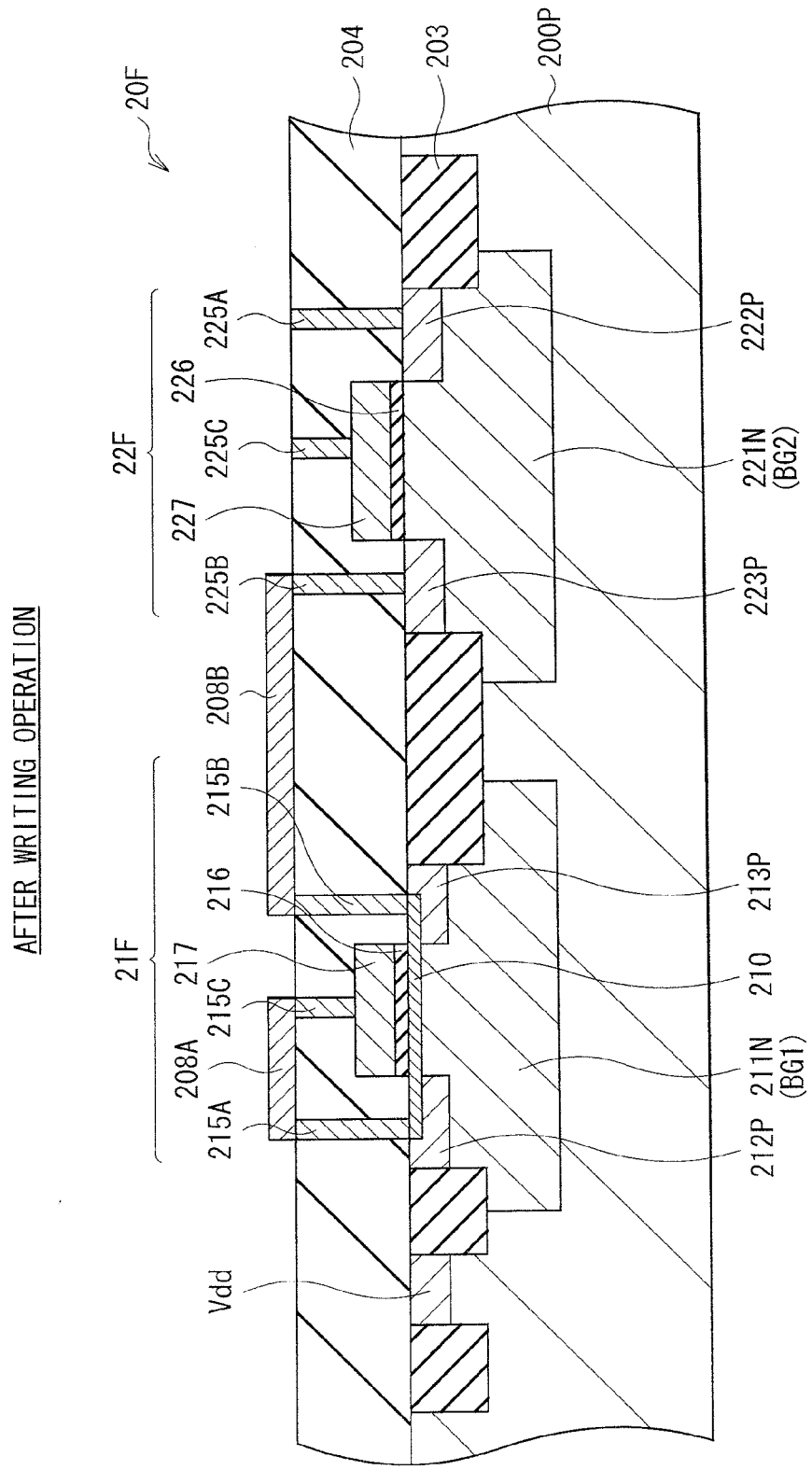
FIG. 26 is a schematic cross-sectional view illustrating a configuration example of a memory cell shown in FIG. 25 after writing operation.

FIGS. 25 and 26 each schematically illustrates a cross-sectional configuration example of a memory cell (memory cell 20F) according to the present embodiment. FIG. 25 illustrates a cross-sectional configuration example before writing operation and FIG. 26 illustrates a cross-sectional configuration example after the writing operation. The memory cell 20F in the present embodiment includes a memory device 21F and a selection transistor 22F instead of the memory device 21 and the selection transistor 22, respectively, in the memory cell 20 in the first embodiment shown in FIGS. 4 and 5.

[Memory Device 21F]

As shown in FIG. 25, the memory device 21F before the writing operation has a laminate structure that includes semiconductor layers 211N, 212P, and 213P, and the electrodes 215A, 215B, and 215C, the insulating layer 204, the wiring 208A, the dielectric film 216, and the conductive film 217. Further, the memory device 21F after the writing operation shown in FIG. 26 includes, in addition to the above-described laminate structure, the filament 210 as in the above-described embodiments and the like. In this example, the filament 210 is formed in a region between the semiconductor layers 212P and 213P through the semiconductor layer 211N, and functions as a conductive path that electrically links the semiconductor layers 212P and 213P (electrodes 215A and 215B).

The semiconductor layer 211N (first semiconductor layer) is an N-type semiconductor layer, and is formed in the semiconductor substrate 200P. The semiconductor layer 211N configures a so-called N-well, and also functions as a back gate (BG1) of the memory device 21F. The semiconductor layer 211N may be formed, for example, of a semiconductor material in which, for example, Si or the like is doped with an impurity such as As and P.

The semiconductor layer 212P (second semiconductor layer) and the semiconductor layer 213P (third semiconductor layer) are so arranged to be separated from each other with a predetermined space in between in the semiconductor layer 211N, and are each a P-type semiconductor layer (each form a so-called P+ layer). The semiconductor layers 212P and 213P may each be made, for example, of a semiconductor material in which, for example, Si or the like is doped with an impurity such as B.

[Selection Transistor 22F]

As shown in FIGS. 25 and 26, the selection transistor 22F before the writing operation and the selection transistor 22F after the writing operation both have the laminate structure that includes the semiconductor layers 221N, 222P, and 223P, the electrodes 225A, 225B, and 225C, the insulating layer 204, the dielectric film 226, and the conductive film 227.

The semiconductor layer 221N (fourth semiconductor layer) is an N-type semiconductor layer and is formed in the semiconductor substrate 200P. The semiconductor layer 221N configures a so-called N-well, and functions also as the back gate (BG2) of the selection transistor 22F. The semiconductor layer 221N may be made, for example, of a semiconductor material in which, for example, Si or the like is doped with an impurity such as As and P.

The semiconductor layer 222P (fifth semiconductor layer) and the semiconductor layer 223P (sixth semiconductor layer) are so arranged as to be separated from each other with a predetermined space in between in the semiconductor layer 221N, and are each a P-type semiconductor layer (each form a so-called P+ layer). The semiconductor layers 222P and 223P may be each made, for example, of a semiconductor material in which, for example, Si or the like is doped with an impurity such as B.

[Writing Operation in Memory Cell 20F]

Also in the present embodiment, the filament 210 is basically formed by a method similar to that in the above-described embodiments and the like, and thereby, writing operation on the memory device 21F is performed.

However, in the present embodiment, the filament 210 is formed by one or both of the conductive component configuring the electrode 215A and the conductive component configuring the electrode 215B that are moved into the semiconductor layer 211N by migration.

Also in the present embodiment, effects similar to those in the above-described embodiments and the like are obtainable from functions similar to those in the above-described embodiment and the like.

Figure 27:
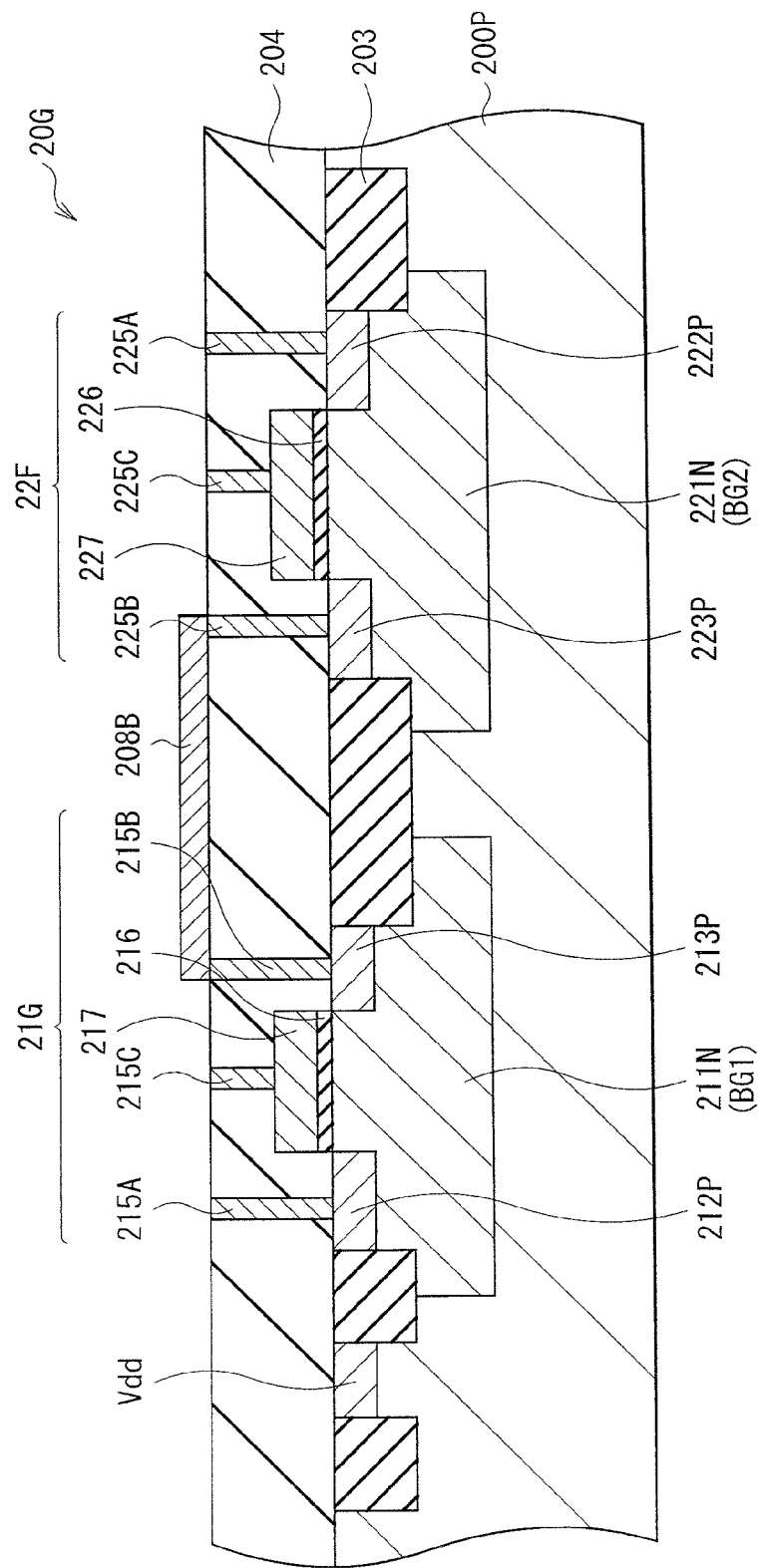
FIG. 27 is a schematic cross-sectional view illustrating another configuration example of the memory cell according to the fifth embodiment.
Figure 28:
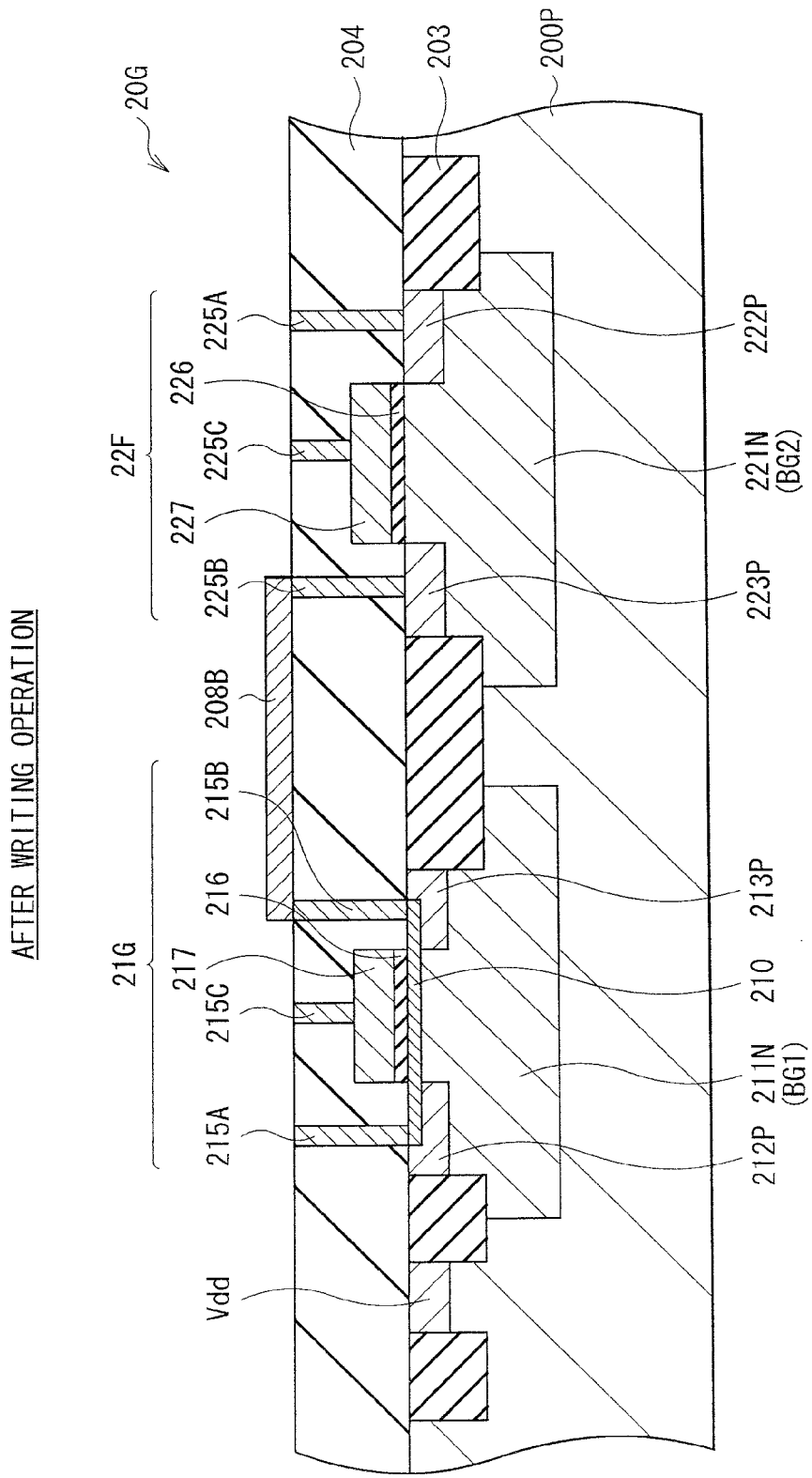
FIG. 28 is a schematic cross-sectional view illustrating a configuration example of a memory cell shown in FIG. 27 after writing operation.

It is to be noted that the present embodiment may have a configuration similar to that in the fourth embodiment, for example, as a memory cell 20G (including a memory device 21G and the selection transistor 22F) shown in FIGS. 27 and 28. In other words, wiring connection (electric connection) between the electrodes 215A and 215C may not be performed in the memory device 21G. Here, FIG. 27 illustrates a cross-sectional configuration example of the memory cell 20G before writing operation, and FIG. 28 illustrates a cross-sectional configuration example of the memory cell 20G after the writing operation. Also in the memory cell 20G with such a configuration, effects similar to those in the fourth embodiment are obtainable from functions similar to those in the fourth embodiment.

Moreover, the silicide layers 212S, 213S, 222S, and 223S may be provided in the semiconductor layers 212P, 213P, 222P, and 223P, respectively, also in the present embodiment as in the above-described Modification 1.

Moreover, one or more of the configurations in the above-described second and third embodiments and Modifications 2 to 4 may be adopted in combination with the present embodiment.

Application Examples

Subsequently, description will be given of examples in which the semiconductor unit (memory unit) described in each of the above embodiments and modifications is applied to an electronic apparatus.

The semiconductor units according to the above-described embodiments and the like of the present disclosure are applicable to electronic apparatuses in any field such as televisions, digital cameras, notebook personal computers, personal digital assistants such as mobile phones, and video camcorder. Specifically, the semiconductor units of the above-described embodiments and the like are applicable to semiconductor units (memory units) embedded in such various electronic apparatuses.

Application Example 1

Figure 29:
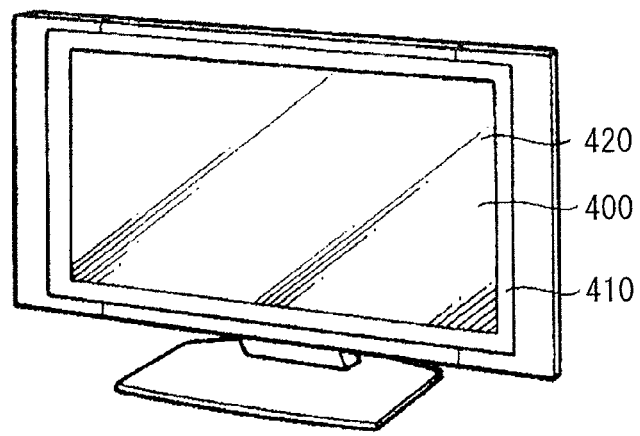
FIG. 29 is a perspective view illustrating an appearance of Application Example 1 in which any of the semiconductor units according to the embodiments and the modifications is applied to an electronic apparatus.

FIG. 29 illustrates an appearance of a television to which any of the semiconductor units of the above-described embodiments and the like is applied. The television may include, for example, an image display screen section 400 that includes a front panel 410 and a filter glass 420.

Application Example 2

Figure 30A:
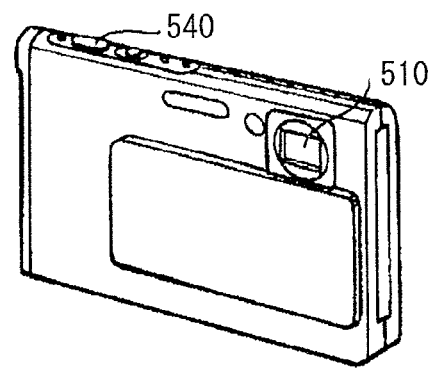
FIGS. 30A and 30B are perspective views each illustrating an appearance of Application Example 2.
Figure 30B:
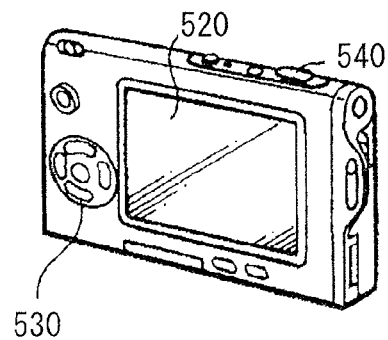

FIGS. 30A and 30B each illustrate an appearance of a digital camera to which any of the semiconductor units of the above-described embodiments and the like is applied. The digital camera may include, for example, a light emission section 510 for flash, a display section 520, a menu switch 530, and a shutter button 540.

[Other Modifications]

Hereinabove, the technology of the present disclosure has been described with reference to the preferred embodiments, the modifications, and the application examples. However, the present technology is not limited to the embodiments and the like and may be variously modified.

For example, materials of the respective layers described in the above embodiments and the like are not limitative, and other materials may be used. Also, the configurations of the components such as the memory device, the memory cell, and the memory unit have been described with specific examples in the above embodiments and the like. However, it is not necessary to provide all of the layers and other layers may be further provided.

Moreover, a case in which the plurality of memory devices are provided in the semiconductor unit (memory unit) has been described in the above embodiments and the like. However, this is not limitative, and a single memory device may be provided in the semiconductor unit.

Moreover, the above embodiments and the like have been described referring to the memory unit as an example of the semiconductor unit of the present disclosure. However, the semiconductor unit may be configured with a semiconductor integrated circuit that also includes other devices (such as a transistor, a capacitor, and a resistive device) in addition to such a memory unit.

It is possible to achieve at least the following configurations from the above-described example embodiments and the modifications of the disclosure.

(1) A semiconductor unit with one or a plurality of memory devices, each of the one or the plurality of memory devices including:

a first semiconductor layer of a first conductivity type;

second and third semiconductor layers of a second conductivity type arranged to be separated from each other in the first semiconductor layer;

a first dielectric film and a first conductive film both being provided on the first semiconductor layer in a region corresponding to a region between the second and third semiconductor layers, the first dielectric film being lower in layer than the first conductive film;

a first electrode electrically connected to the second semiconductor layer;

a second electrode electrically connected to the third semiconductor layer; and a third electrode electrically connected to the first conductive film, the third electrode being electrically connected to the first electrode, wherein in the one or the plurality of memory devices, when a voltage equal to or higher than a predetermined threshold value is applied between the first electrode and the second electrode, a filament is formed in the region between the second semiconductor layer and the third semiconductor layer, and thereby, writing operation of information is performed, the filament being a conductive path electrically linking the second semiconductor layer and the third semiconductor layer.

(2) The semiconductor unit according to (1), wherein one or more selection transistors are connected in series to the one or the plurality of memory devices in a one-to-one relationship, the one or more selection transistors each selecting a memory device to be driven out of the one or the plurality of memory devices, and the selection transistor is turned on, and thereby, a potential difference equal to or larger than the threshold value is generated between the first electrode and the second electrode in the memory device to be driven.

(3) The semiconductor unit according to (2), wherein, in the memory device to be driven, the selection transistor corresponding to the memory device to be driven is tuned on to allow voltages with opposite polarities to be applied to the respective first and second electrodes, and thereby a potential difference equal to or larger than the threshold value is generated between the first electrode and the second electrode.

(4) The semiconductor unit according to (2), wherein, in the memory device to be driven, the selection transistor corresponding to the memory device to be driven is turned on not to allow voltages with opposite polarities to be applied to the first and second electrodes, and thereby a potential difference equal to or larger than the threshold value is generated between the first electrode and the second electrode.

(5) The semiconductor unit according to any one of (2) to (4), wherein the one or more selection transistors each include a fourth semiconductor layer of the first conductivity type, fifth and sixth semiconductor layers of the second conductivity type arranged to be separated from each other in the fourth semiconductor layer, a second dielectric film and a second conductive film both being provided on the fourth semiconductor layer in a region corresponding to a region between the fifth and sixth semiconductor layers, the second dielectric film being lower in layer than the second conductive film, a fourth electrode electrically connected to the fifth semiconductor layer, a fifth electrode electrically connected to the sixth semiconductor layer, and a sixth electrode electrically connected to the second conductive film, and the second electrode in each of the one or the plurality of memory devices is electrically connected to the fifth electrode in each of the one or more selection transistors.

(6) The semiconductor unit according to (5), wherein, when the filament is formed in the memory device to be driven due to the writing operation, a parasitic diode formed between the sixth and fourth semiconductor layers in the selection transistor corresponding to the memory device to be driven is tuned on in a forward direction.

(7) The semiconductor unit according to (5) or (6), wherein a current extracting section is provided in the fourth semiconductor layer, the current extracting section locally extracting a write current flowing between the memory device to be driven and the selection transistor corresponding thereto upon the writing operation.

(8) The semiconductor unit according to any one of (5) to (7), wherein a diffusion layer of the second conductivity type is provided around the sixth semiconductor layer in the fourth semiconductor layer.

(9) The semiconductor unit according to any one of (5) to (8), wherein the first semiconductor layer is formed in a seventh semiconductor layer of the second conductivity type, and the first semiconductor layer is electrically separated from the fourth semiconductor layer by the seventh semiconductor layer.

(10) The semiconductor unit according to (9), wherein a bipolar transistor is formed, in a region between the second electrode and the fifth electrode, with the sixth semiconductor layer, the fourth semiconductor layer, and the seventh semiconductor layer.

(11) The semiconductor unit according to (10), wherein the bipolar transistor operates upon the writing operation, and thereby, a write current flowing between the memory device to be driven and the selection transistor corresponding thereto flows also to the seventh semiconductor layer through the bipolar transistor, in addition to the fourth semiconductor layer.

(12) The semiconductor unit according to any one of (5) to (11), wherein a separation length between the second semiconductor layer and the third semiconductor layer is shorter than a separation length between the fifth semiconductor layer and the sixth semiconductor layer.

(13) The semiconductor unit according to any one of (2) to (12), wherein a resistance value of the filament is lower than an ON-resistance value of the selection transistor.

(14) The semiconductor unit according to any one of (1) to (13), further including a drive section performing the writing operation on a memory device to be driven out of the one or the plurality of memory devices by applying a voltage equal to or higher than the threshold value between the first electrode and the second electrode.

(15) The semiconductor unit according to any one of (1) to (14), wherein one or both of a conductive component configuring the first electrode and a conductive component configuring the second electrode are moved by migration, and thereby, the filament is formed.

(16) The semiconductor unit according to any one of (1) to (14), wherein a silicide layer is provided in each of the second and third semiconductor layers.

(17) The semiconductor unit according to (16), wherein one or more of conductive components configuring the first electrode, configuring the second electrode, and configuring the silicide layer are moved by migration, and thereby, the filament is formed.

(18) An electronic apparatus with a semiconductor unit with one or a plurality of memory devices, each of the one or the plurality of memory devices including:

a first semiconductor layer of a first conductivity type;

second and third semiconductor layers of a second conductivity type arranged to be separated from each other in the first semiconductor layer;

a first dielectric film and a first conductive film both being provided on the first semiconductor layer in a region corresponding to a region between the second and third semiconductor layers, the first dielectric film being lower in layer than the first conductive film;

a first electrode electrically connected to the second semiconductor layer;

a second electrode electrically connected to the third semiconductor layer; and a third electrode electrically connected to the first conductive film, the third electrode being electrically connected to the first electrode, wherein in the one or the plurality of memory devices, when a voltage equal to or higher than a predetermined threshold value is applied between the first electrode and the second electrode, a filament is formed in the region between the second semiconductor layer and the third semiconductor layer, and thereby, writing operation of information is performed, the filament being a conductive path electrically linking the second semiconductor layer and the third semiconductor layer.

(19) A memory device including:

a first semiconductor layer of a first conductivity type;

second and third semiconductor layers of a second conductivity type arranged to be separated from each other in the first semiconductor layer;

a first dielectric film and a first conductive film both being provided on the first semiconductor layer in a region corresponding to a region between the second and third semiconductor layers, the first dielectric film being lower in layer than the first conductive film;

a first electrode electrically connected to the second semiconductor layer;

a second electrode electrically connected to the third semiconductor layer; and a third electrode electrically connected to the first conductive film, the third electrode being electrically connected to the first electrode, wherein when a voltage equal to or higher than a predetermined threshold value is applied between the first electrode and the second electrode, a filament is formed in the region between the second semiconductor layer and the third semiconductor layer, and thereby, writing operation of information is performed, the filament being a conductive path electrically linking the second semiconductor layer and the third semiconductor layer.

(20) A method of operating a semiconductor unit, the method including, with respect to a memory device to be driven out of one or a plurality of memory devices each including: a first semiconductor layer of a first conductivity type; second and third semiconductor layers of a second conductivity type arranged to be separated from each other in the first semiconductor layer; a first dielectric film and a first conductive film both being provided on the first semiconductor layer in a region corresponding to a region between the second and third semiconductor layers, the first dielectric film being lower in layer than the first conductive film; a first electrode electrically connected to the second semiconductor layer; a second electrode electrically connected to the third semiconductor layer; and a third electrode electrically connected to the first conductive film, the third electrode being electrically connected to the first electrode, performing writing operation of information by applying, a voltage equal to or higher than a predetermined threshold value, between the first electrode and the second electrode to form a filament in the region between the second semiconductor layer and the third semiconductor layer, the filament being a conductive path electrically linking the second semiconductor layer and the third semiconductor layer.

The present application contains subject matter related to that disclosed in Japanese Priority Patent Application JP 2012-103239 filed in the Japan Patent Office on Apr. 27, 2012 the entire content of which is hereby incorporated by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A semiconductor unit with one or a plurality of memory devices, each of the one or the plurality of memory devices comprising:

a first semiconductor layer of a first conductivity type;

second and third semiconductor layers of a second conductivity type arranged to be separated from each other in the first semiconductor layer;

a first dielectric film and a first conductive film both being provided on the first semiconductor layer in a region corresponding to a region between the second and third semiconductor layers, the first dielectric film being lower in layer than the first conductive film;

a first electrode electrically connected to the second semiconductor layer;

a second electrode electrically connected to the third semiconductor layer; and a third electrode electrically connected to the first conductive film, the third electrode being electrically connected to the first electrode, wherein in the one or the plurality of memory devices, when a voltage equal to or higher than a predetermined threshold value is applied between the first electrode and the second electrode, a filament is formed in the region between the second semiconductor layer and the third semiconductor layer, and thereby, writing operation of information is performed, the filament being a conductive path electrically linking the second semiconductor layer and the third semiconductor layer.

2. The semiconductor unit according to claim 1, wherein one or more selection transistors are connected in series to the one or the plurality of memory devices in a one-to-one relationship, the one or more selection transistors each selecting a memory device to be driven out of the one or the plurality of memory devices, and the selection transistor is turned on, and thereby, a potential difference equal to or larger than the threshold value is generated between the first electrode and the second electrode in the memory device to be driven.

3. The semiconductor unit according to claim 2, wherein, in the memory device to be driven, the selection transistor corresponding to the memory device to be driven is tuned on to allow voltages with opposite polarities to be applied to the respective first and second electrodes, and thereby a potential difference equal to or larger than the threshold value is generated between the first electrode and the second electrode.

4. The semiconductor unit according to claim 2, wherein, in the memory device to be driven, the selection transistor corresponding to the memory device to be driven is turned on not to allow voltages with opposite polarities to be applied to the first and second electrodes, and thereby a potential difference equal to or larger than the threshold value is generated between the first electrode and the second electrode.

5. The semiconductor unit according to claim 2, wherein the one or more selection transistors each include a fourth semiconductor layer of the first conductivity type, fifth and sixth semiconductor layers of the second conductivity type arranged to be separated from each other in the fourth semiconductor layer, a second dielectric film and a second conductive film both being provided on the fourth semiconductor layer in a region corresponding to a region between the fifth and sixth semiconductor layers, the second dielectric film being lower in layer than the second conductive film, a fourth electrode electrically connected to the fifth semiconductor layer, a fifth electrode electrically connected to the sixth semiconductor layer, and a sixth electrode electrically connected to the second conductive film, and the second electrode in each of the one or the plurality of memory devices is electrically connected to the fifth electrode in each of the one or more selection transistors.

6. The semiconductor unit according to claim 5, wherein, when the filament is formed in the memory device to be driven due to the writing operation, a parasitic diode formed between the sixth and fourth semiconductor layers in the selection transistor corresponding to the memory device to be driven is tuned on in a forward direction.

7. The semiconductor unit according to claim 5, wherein a current extracting section is provided in the fourth semiconductor layer, the current extracting section locally extracting a write current flowing between the memory device to be driven and the selection transistor corresponding thereto upon the writing operation.

8. The semiconductor unit according to claim 5, wherein a diffusion layer of the second conductivity type is provided around the sixth semiconductor layer in the fourth semiconductor layer.

9. The semiconductor unit according to claim 5, wherein
the first semiconductor layer is formed in a seventh semiconductor layer of the second conductivity type, and
the first semiconductor layer is electrically separated from the fourth semiconductor layer by the seventh semiconductor layer.

10. The semiconductor unit according to claim 9, wherein a bipolar transistor is formed, in a region between the second electrode and the fifth electrode, with the sixth semiconductor layer, the fourth semiconductor layer, and the seventh semiconductor layer.

11. The semiconductor unit according to claim 10, wherein the bipolar transistor operates upon the writing operation, and thereby, a write current flowing between the memory device to be driven and the selection transistor corresponding thereto flows also to the seventh semiconductor layer through the bipolar transistor, in addition to the fourth semiconductor layer.

12. The semiconductor unit according to claim 5, wherein a separation length between the second semiconductor layer and the third semiconductor layer is shorter than a separation length between the fifth semiconductor layer and the sixth semiconductor layer.

13. The semiconductor unit according to claim 2, wherein a resistance value of the filament is lower than an ON-resistance value of the selection transistor.

14. The semiconductor unit according to claim 1, further comprising a drive section performing the writing operation on a memory device to be driven out of the one or the plurality of memory devices by applying a voltage equal to or higher than the threshold value between the first electrode and the second electrode.

15. The semiconductor unit according to claim 1, wherein one or both of a conductive component configuring the first electrode and a conductive component configuring the second electrode are moved by migration, and thereby, the filament is formed.

16. The semiconductor unit according to claim 1, wherein a silicide layer is provided in each of the second and third semiconductor layers.

17. The semiconductor unit according to claim 16, wherein one or more of conductive components configuring the first electrode, configuring the second electrode, and configuring the silicide layer are moved by migration, and thereby, the filament is formed.

18. An electronic apparatus with a semiconductor unit with one or a plurality of memory devices, each of the one or the plurality of memory devices comprising:
a first semiconductor layer of a first conductivity type;
second and third semiconductor layers of a second conductivity type arranged to be separated from each other in the first semiconductor layer;
a first dielectric film and a first conductive film both being provided on the first semiconductor layer in a region corresponding to a region between the second and third semiconductor layers, the first dielectric film being lower in layer than the first conductive film;
a first electrode electrically connected to the second semiconductor layer;
a second electrode electrically connected to the third semiconductor layer; and
a third electrode electrically connected to the first conductive film, the third electrode being electrically connected to the first electrode, wherein
in the one or the plurality of memory devices, when a voltage equal to or higher than a predetermined threshold value is applied between the first electrode and the second electrode, a filament is formed in the region between the second semiconductor layer and the third semiconductor layer, and thereby, writing operation of information is performed, the filament being a conductive path electrically linking the second semiconductor layer and the third semiconductor layer.

19. A memory device comprising:
a first semiconductor layer of a first conductivity type;
second and third semiconductor layers of a second conductivity type arranged to be separated from each other in the first semiconductor layer;
a first dielectric film and a first conductive film both being provided on the first semiconductor layer in a region corresponding to a region between the second and third semiconductor layers, the first dielectric film being lower in layer than the first conductive film;
a first electrode electrically connected to the second semiconductor layer;
a second electrode electrically connected to the third semiconductor layer; and
a third electrode electrically connected to the first conductive film, the third electrode being electrically connected to the first electrode, wherein
when a voltage equal to or higher than a predetermined threshold value is applied between the first electrode and the second electrode, a filament is formed in the region between the second semiconductor layer and the third semiconductor layer, and thereby, writing operation of information is performed, the filament being a conductive path electrically linking the second semiconductor layer and the third semiconductor layer.

20. A method of operating a semiconductor unit, the method comprising,
with respect to a memory device to be driven out of one or a plurality of memory devices each including: a first semiconductor layer of a first conductivity type; second and third semiconductor layers of a second conductivity type arranged to be separated from each other in the first semiconductor layer; a first dielectric film and a first conductive film both being provided on the first semiconductor layer in a region corresponding to a region between the second and third semiconductor layers, the first dielectric film being lower in layer than the first conductive film; a first electrode electrically connected to the second semiconductor layer; a second electrode electrically connected to the third semiconductor layer; and a third electrode electrically connected to the first conductive film, the third electrode being electrically connected to the first electrode, performing writing operation of information by applying, a voltage equal to or higher than a predetermined threshold value, between the first electrode and the second electrode to form a filament in the region between the second semiconductor layer and the third semiconductor layer, the filament being a conductive path electrically linking the second semiconductor layer and the third semiconductor layer.

* * * * *